US009356049B2

(12) United States Patent
Ikeda et al.

(10) Patent No.: US 9,356,049 B2
(45) Date of Patent: May 31, 2016

(54) DISPLAY DEVICE WITH A TRANSISTOR ON AN OUTER SIDE OF A BENT PORTION

(71) Applicant: Semiconductor Energy Laboratory Co., Ltd., Atsugi-shi, Kanagawa-ken (JP)

(72) Inventors: Hisao Ikeda, Zama (JP); Hideki Uochi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/336,329

(22) Filed: Jul. 21, 2014

(65) Prior Publication Data

US 2015/0028328 A1 Jan. 29, 2015

(30) Foreign Application Priority Data

Jul. 26, 2013 (JP) ................. 2013-155990

(51) Int. Cl.
*H01L 29/10* (2006.01)
*H01L 27/12* (2006.01)

(52) U.S. Cl.
CPC ........ *H01L 27/1218* (2013.01); *H01L 27/1225* (2013.01); *H01L 27/1266* (2013.01); *G06F 2203/04102* (2013.01)

(58) Field of Classification Search
CPC ............ H01L 27/1218; H01L 27/1255; H01L 27/1225; H01L 27/124; H01L 27/1266
USPC ................................. 257/43, 59, 72
See application file for complete search history.

(56) References Cited

U.S. PATENT DOCUMENTS

| | | |
|---|---|---|
| 5,273,475 A | 12/1993 | Oshikawa |
| 8,138,502 B2 | 3/2012 | Nakamura et al. |
| 8,182,633 B2 | 5/2012 | Yoon et al. |
| 8,415,208 B2 | 4/2013 | Takayama et al. |
| 8,508,682 B2 | 8/2013 | Yamazaki et al. |
| 8,610,155 B2 | 12/2013 | Hatano et al. |
| 8,647,919 B2 | 2/2014 | Yamazaki et al. |
| 8,956,891 B2 | 2/2015 | Chida |
| 2004/0238827 A1* | 12/2004 | Takayama et al. ............... 257/79 |
| 2009/0021666 A1* | 1/2009 | Chen .................................. 349/58 |
| 2009/0122223 A1 | 5/2009 | Hayano et al. |
| 2010/0253902 A1 | 10/2010 | Yamazaki et al. |
| 2012/0146036 A1* | 6/2012 | Minami et al. .................. 257/59 |
| 2013/0161684 A1 | 6/2013 | Momma et al. |
| 2013/0240855 A1 | 9/2013 | Chida et al. |
| 2014/0029212 A1 | 1/2014 | Hwang et al. |
| 2014/0039212 A1 | 1/2014 | Hwang at el. |
| 2014/0111954 A1 | 4/2014 | Lee et al. |
| 2014/0264425 A1 | 9/2014 | Chida |
| 2014/0306288 A1 | 10/2014 | Adachi et al. |
| 2014/0321074 A1 | 10/2014 | Chida et al. |

(Continued)

FOREIGN PATENT DOCUMENTS

JP 2003-174153 6/2003

*Primary Examiner* — Hung Vu
(74) *Attorney, Agent, or Firm* — Robinson Intellectual Property Law Office; Eric J. Robinson

(57) ABSTRACT

A non-breakable display device, electronic appliance, or lighting device is provided. A bendable display device in which a first flexible substrate and a second flexible substrate provided with transistors overlap each other with a bonding layer therebetween is fabricated. The display device is bent so that the first substrate is positioned on the inner side (the valley side) and the second substrate is positioned on the outer side (the mountain side).

24 Claims, 19 Drawing Sheets

(56) References Cited

U.S. PATENT DOCUMENTS

| | | |
|---|---|---|
| 2014/0361980 A1 | 12/2014 | Iwaki et al. |
| 2014/0375660 A1 | 12/2014 | Tamaki |
| 2015/0009128 A1 | 1/2015 | Matsumoto |
| 2015/0016126 A1 | 1/2015 | Hirakata et al. |

* cited by examiner

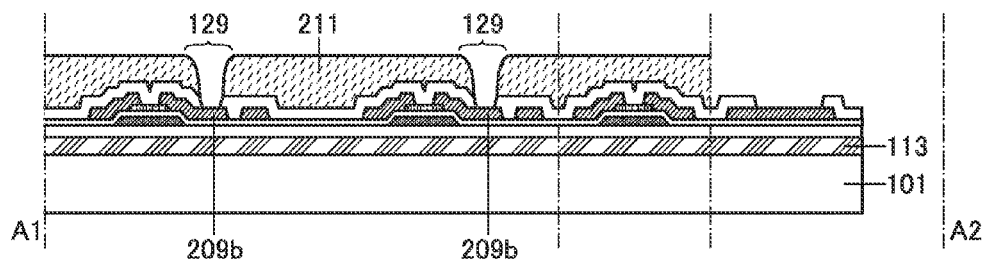
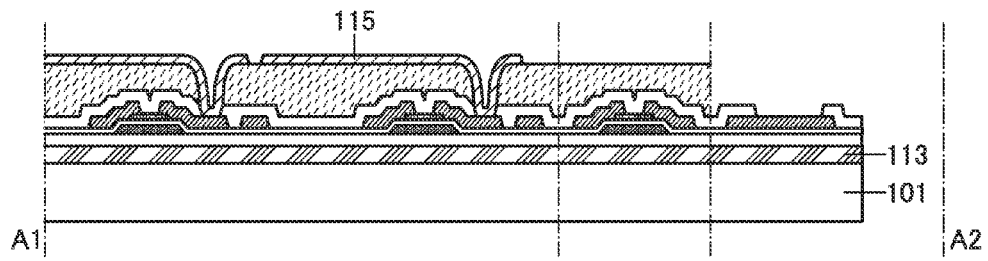
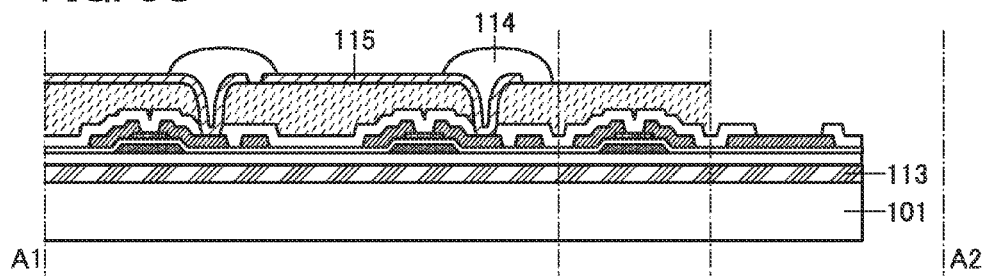
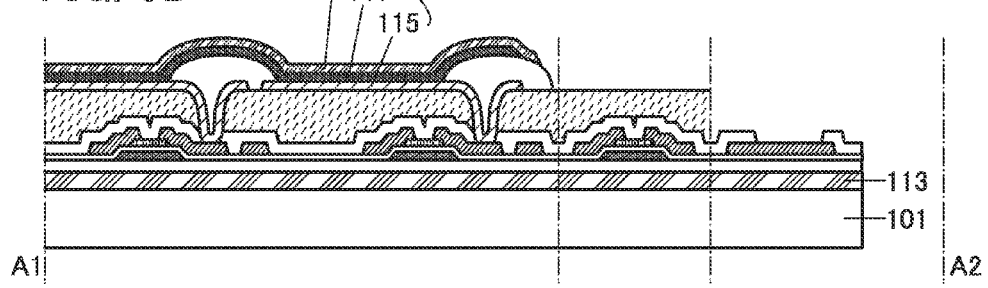

DISPLAY DEVICE WITH A TRANSISTOR ON AN OUTER SIDE OF A BENT PORTION

BACKGROUND OF THE INVENTION

1. Field of the Invention

The present invention relates to an object, a method, or a manufacturing method. The present invention relates to a process, a machine, manufacture, or a composition of matter. In particular, one embodiment of the present invention relates to a light-emitting device, a display device, an electronic appliance, a lighting device, a fabrication method thereof, usage thereof, or an operation method thereof. In particular, one embodiment of the present invention relates to a light-emitting device, a display device, an electronic appliance, or a lighting device that utilizes electroluminescence (EL), a fabrication method thereof, usage thereof, or an operation method thereof.

2. Description of the Related Art

Recent light-emitting devices and display devices are expected to be used for a variety of purposes and become diversified.

For example, light-emitting devices and display devices for mobile devices and the like are required to be thin, lightweight, and non-breakable.

Light-emitting elements utilizing EL (also referred to as EL elements) have features such as ease of thinning and lightening, high-speed response to input signal, and driving with a direct-current low voltage source; therefore, application of the light-emitting elements to light-emitting devices and display devices has been proposed.

For example, Patent Document 1 discloses a flexible active matrix display device in which an organic EL element or a transistor serving as a switching element is provided over a film substrate.

REFERENCE

Patent Document 1: Japanese Published Patent Application No. 2003-174153

SUMMARY OF THE INVENTION

An object of one embodiment of the present invention is to provide a highly portable display device, electronic appliance, or lighting device.

Another object of one embodiment of the present invention is to provide a highly reliable display device, electronic appliance, or lighting device.

Another object of one embodiment of the present invention is to provide a non-breakable display device, electronic appliance, or lighting device.

Another object of one embodiment of the present invention is to provide a low-power-consumption display device, electronic appliance, or lighting device.

Another object of one embodiment of the present invention is to provide a novel display device, electronic appliance, or lighting device.

A bendable display device in which a first flexible substrate and a second flexible substrate provided with transistors overlap each other with a bonding layer therebetween is fabricated. The display device is bent so that the second substrate is positioned on the outer side (the mountain side) in a bend portion. In other words, the display device is bent so that the first substrate is positioned on the inner side (the valley side) in the bend portion.

One embodiment of the present invention is a display device that includes a first substrate and a second substrate provided with transistors. The first substrate and the second substrate overlap each other with a bonding layer therebetween. The display device includes a bend portion where the first substrate is positioned on the inner side and the second substrate is positioned on the outer side.

Another embodiment of the present invention is a display device that includes a first substrate and a second substrate provided with transistors. The first substrate and the second substrate overlap each other with a bonding layer therebetween. The display device includes a plurality of bend portions where the first substrate is positioned on the inner side and the second substrate is positioned on the outer side.

Another embodiment of the present invention is a bendable display device that includes a first substrate and a second substrate provided with transistors. The bendable display device is bent so that the first substrate is positioned on the inner side and the second substrate is positioned on the outer side in a bend portion.

A flexible substrate is used as the first substrate. A flexible substrate is used as the second substrate. With such substrates, a non-breakable display device can be provided. Alternatively, a lightweight display device can be provided. Alternatively, an easily bendable display device can be provided.

Wirings for supplying signals to the transistors are formed over the second substrate provided with the transistors and the like. In addition, a plurality of insulating layers are formed. Note that the wirings for supplying signals to the transistors are preferably formed in a grid pattern. The second substrate provided with the wirings, the insulating layers, and the like has higher mechanical strength than the first substrate.

Thus, when the display device is bent so that the second substrate is positioned on the outer side (mountain side) in the bend portion, so that the display device is less likely to be broken even when repeatedly bent and extended. This results in improved reliability of the display device.

In one embodiment of the present invention, a highly portable display device, electronic appliance, or lighting device can be provided.

In one embodiment of the present invention, a highly reliable display device, electronic appliance, or lighting device can be provided.

In one embodiment of the present invention, a non-breakable display device, electronic appliance, or lighting device can be provided.

In one embodiment of the present invention, a low-power-consumption display device, electronic appliance, or lighting device can be provided.

In one embodiment of the present invention, a novel display device, electronic appliance, or lighting device can be provided.

BRIEF DESCRIPTION OF THE DRAWINGS

FIGS. 5A to 5D are cross-sectional views illustrating an example of a method for fabricating a display device.

DETAILED DESCRIPTION OF THE INVENTION

Figure 1A:
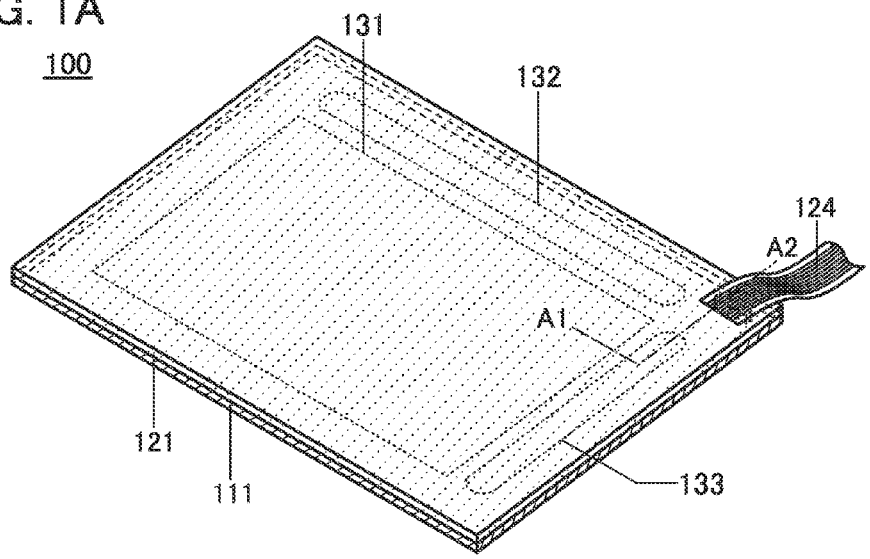
FIGS. 1A and 1B illustrate one mode of a display device.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the invention should not be construed as being limited to the description in the following embodiments. Note that in the structures of the invention described below, the same portions or portions having similar functions are denoted by the same reference numerals in different drawings, and description of such portions is not repeated.

Note that in each drawing referred to in this specification, the size of each component or the thickness of each layer might be exaggerated or a region might be omitted for clarity of the invention. Therefore, the scale of each component is not necessarily limited to that illustrated in the drawing. Especially in a top view or a perspective view, some components might not be illustrated for easy understanding.

The position, size, range, and the like of each component illustrated in the drawings and the like are not accurately represented in some cases to facilitate understanding of the invention. Therefore, the disclosed invention is not necessarily limited to the position, the size, the range, or the like disclosed in the drawings and the like. For example, in the actual fabrication process, a resist mask or the like might be unintentionally reduced in size by treatment such as etching, which is not illustrated in some cases for easy understanding.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among component.

In this specification and the like, the term "electrode" or "wiring" does not limit a function of a component. For example, an "electrode" is used as part of a "wiring" in some cases, and vice versa. In addition, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, e.g., when a transistor having a different polarity is employed or a direction of current flow is changed in circuit operation. Thus, the terms "source" and "drain" can be switched in this specification.

In this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used in this specification, there is a case in which no physical connection is made and a wiring is just extended in an actual circuit.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification, in the case where an etching step is performed after a photolithography process, a resist mask formed in the photolithography process is removed after the etching step, unless otherwise specified.

Embodiment 1

Figure 1B:
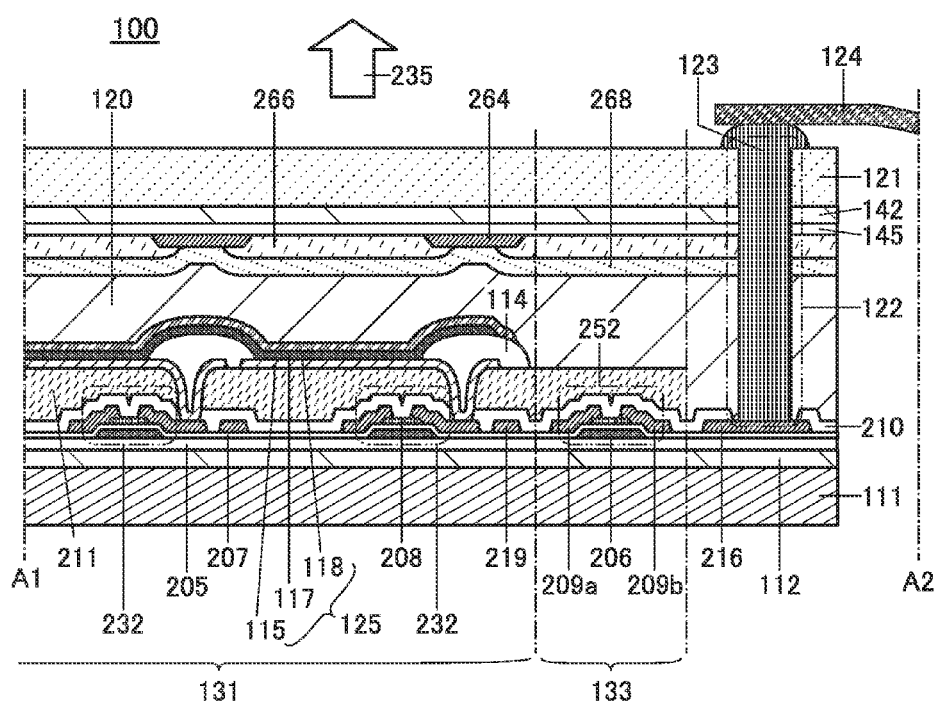

A structure example of a display device 100 of one embodiment of the present invention is described with reference to FIGS. 1A and 1B. FIG. 1A is a top perspective view of the display device 100 and FIG. 1B is a cross-sectional view taken along the dashed-dotted line A1-A2 in FIG. 1A.

<Structure of Display Device>

The display device 100 described in this embodiment includes a display area 131, a driver circuit 132, and a driver circuit 133. In addition, the display device 100 includes a terminal electrode 216 and a light-emitting element 125 including a first electrode 115, an EL layer 117, and a second electrode 118. A plurality of light-emitting elements 125 are formed in the display area 131. A transistor 232 for controlling the amount of light emitted from the light-emitting element 125 is connected to each light-emitting element 125.

The terminal electrode 216 is electrically connected to an external electrode 124 through an anisotropic conductive connection layer 123 formed in an opening 122. In addition, the terminal electrode 216 is electrically connected to the driver circuit 132 and the driver circuit 133.

The driver circuit 132 and the driver circuit 133 each include a plurality of transistors 252. The driver circuit 132 and the driver circuit 133 each have a function of determining which of the light-emitting elements 125 in the display area 131 is supplied with a signal from the external electrode 124.

In the display device 100 illustrated in FIGS. 1A and 1B a substrate 111 and a substrate 121 are attached to each other with a bonding layer 120 therebetween. An insulating layer 205 is formed over the substrate 111 with a bonding layer 112 therebetween. The insulating layer 205 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 can be formed by a sputtering method, a CVD method, a thermal oxidation method, a coating method, a printing method, or the like.

An insulating layer 145 is formed on the substrate 121 with a bonding layer 142 therebetween. A light-blocking layer 264 is formed on the substrate 121 with the insulating layer 145 therebetween. In addition, a coloring layer 266 and an overcoat layer 268 are formed on the substrate 121 with the insulating layer 145 therebetween.

Note that the insulating layer 205 functions as a base layer and can prevent or reduce diffusion of moisture or impurity elements from the substrate 111, the bonding layer 112, or the like to the transistor or the light-emitting element. Note that the insulating layer 145 functions as a base layer and can prevent or reduce diffusion of moisture or impurity elements from the substrate 121, the bonding layer 142, or the like to the transistor or the light-emitting element. The insulating layer 145 can be formed using a material and a method similar to those of the insulating layer 205.

An organic resin material, a glass material that is thin enough to have flexibility, or the like can be used for the substrate 111 and the substrate 121. In the case where the display device 100 is what is called a bottom-emission display device or a dual-emission display device, a material that transmits light emitted from the EL layer 117 is used for the substrate 111. In the case where the display device 100 is a top-emission display device or a dual-emission display device, a material that transmits light emitted from the EL layer 117 is used for the substrate 121.

Examples of materials that have flexibility and transmit visible light, which can be used for the substrate 111 and the substrate 121, include a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, or the like. In the case where light does not have to be transmitted, a non-light-transmitting substrate may be used. The substrate 121 or the substrate 111 may be, for example, a stainless steel substrate or a stainless steel foil substrate.

The thermal expansion coefficients of the substrate 111 and the substrate 121 are preferably less than or equal to 30 ppm/K, more preferably less than or equal to 10 ppm/K. In addition, on surfaces of the substrate 111 and the substrate 121, a protective film having low water permeability may be formed in advance; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 111 and the substrate 121.

With such substrates, a non-breakable display device can be provided. Alternatively, a lightweight display device can be provided. Alternatively, an easily bendable display device can be provided.

In addition, the transistor 232, the transistor 252, the terminal electrode 216, and a wiring 219 are formed over the insulating layer 205. Note that although a channel-etched transistor that is a type of bottom-gate transistor is illustrated as the transistor 232 and the transistor 252 in this embodiment, a channel-protective transistor, a top-gate transistor, or the like can also be used. It is also possible to use a dual-gate transistor, in which a semiconductor layer in which a channel is formed is interposed between two gate electrodes.

The transistor 232 and the transistor 252 may have the same structure. However, the size (e.g., channel length and channel width) or the like of each transistor can be adjusted as appropriate.

The transistor 232 and the transistor 252 each include a gate electrode 206, a gate insulating layer 207, a semiconductor layer 208, a source electrode 209a, and a drain electrode 209b.

The electrode 216, the wiring 219, the gate electrode 206, the source electrode 209a, and the drain electrode 209b can be formed using a material and a method similar to those of the terminal electrode 216 described later. In addition, the gate insulating layer 207 can be formed using a material and a method similar to those of the insulating layer 205.

The semiconductor layer 208 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In the case of using an organic semiconductor for the semiconductor layer 208, a low molecular organic material having an aromatic ring, a I-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

In the case of using an oxide semiconductor for the semiconductor layer 208, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

Note that an oxide semiconductor has an energy gap as wide as 3.0 eV or more and high visible-light transmissivity. In a transistor obtained by processing an oxide semiconductor under appropriate conditions, the off-state current at ambient temperature (e.g., 25° C.) can be less than or equal to 100 zA ($1 \times 10^{-19}$ A), less than or equal to 10 zA ($1 \times 10^{-20}$ A), and further less than or equal to 1 zA ($1 \times 10^{-21}$ A). Thus, a display device with low power consumption can be provided.

In the case of using an oxide semiconductor for the semiconductor layer 208, an insulating layer containing oxygen is preferably used as an insulating layer that is in contact with the semiconductor layer 208.

In addition, an insulating layer 210 is formed over the transistor 232 and the transistor 252, and an insulating layer 211 is formed over the insulating layer 210. The insulating layer 210 functions as a protective insulating layer and can prevent or reduce diffusion of impurity elements from a layer above the insulating layer 210 to the transistor 232 and the transistor 252. The insulating layer 210 can be formed using a material and a method similar to those of the insulating layer 205.

Planarization treatment may be performed on the insulating layer 211 to reduce unevenness of a surface on which the light-emitting element 125 is formed. The planarization treatment may be, but not particularly limited to, polishing treatment (e.g., chemical mechanical polishing (CMP)) or dry etching treatment.

Forming the insulating layer 211 using an insulating material with a planarization function can make polishing treatment unnecessary. As the insulating material with a planarization function, for example, an organic material such as a polyimide resin or an acrylic resin can be used. Other than such organic materials, it is also possible to use a low-dielectric constant material (a low-k material) or the like. Note that the insulating layer 211 may be formed by stacking a plurality of insulating layers formed using any of these materials.

In addition, over the insulating layer 211, the light-emitting element 125 and the partition 114 for separating the adjacent light-emitting elements 125 are formed.

The display device 100 is what is called a top-emission display device, in which light 235 emitted from the light-emitting element 125 is extracted from the substrate 121 side through the coloring layer 266.

The light-emitting element 125 is electrically connected to the transistor 232 through openings formed in the insulating layer 211 and the insulating layer 210.

The substrate 121 is formed to face the substrate 111 and may thus be called a "counter substrate".

Figure 15A:
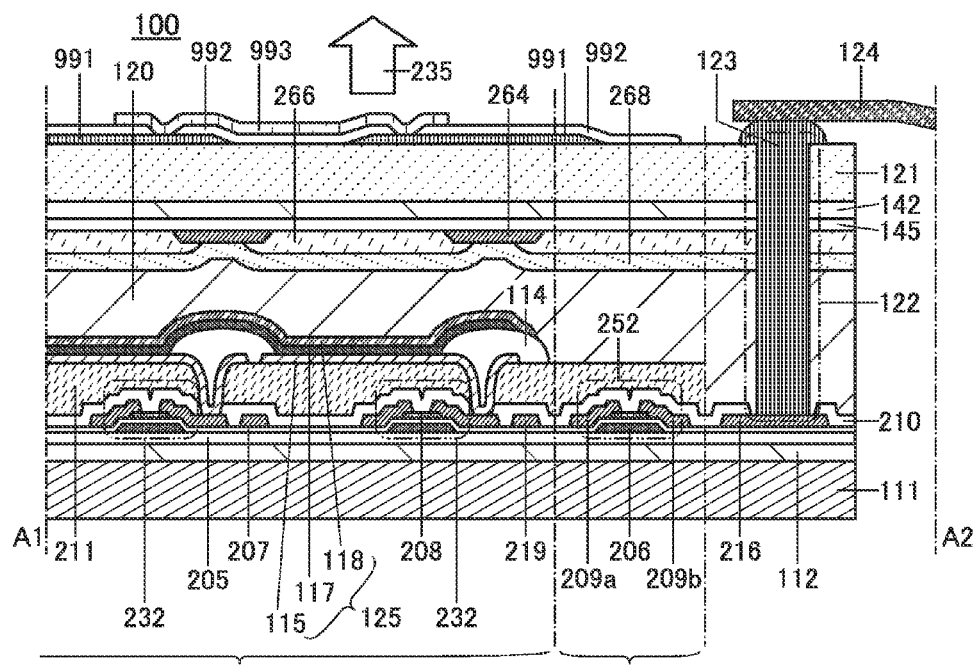
FIGS. 15A and 15B each illustrate one mode of a display device.

Note that as illustrated in FIG. 15A, a touch sensor may be provided over the substrate 121. Providing the touch sensor directly over the substrate 121 as described above can reduce displacement of the touch sensor when the display device is bent. The touch sensor is formed using a conductive layer 991, a conductive layer 992, and the like. In addition, an insulating layer 993 is formed between the conductive layers.

As the conductive layer 991 and/or the conductive layer 992, a transparent conductive film of indium tin oxide, indium zinc oxide, or the like is preferably used. Note that a layer containing a low-resistance material may be used for part or the whole of the conductive layer 991 and/or the conductive layer 992 in order to reduce resistance. For example, the conductive layer 991 and/or the conductive layer 992 can be formed as a single layer or a stack using any of metals such as aluminum, titanium, chromium, nickel, copper, yttrium, zirconium, molybdenum, silver, tantalum, and tungsten and an alloy containing any of these metals as a main component. Alternatively, a metal nanowire may be used as the conductive layer 991 and/or the conductive layer 992. Silver or the like is preferably used as a metal for the metal nanowire, in which case the resistance value can be reduced and the sensitivity of the sensor can be improved.

The insulating layer 993 is preferably formed as a single layer or a multilayer using silicon oxide, silicon nitride, silicon oxynitride, silicon nitride oxide, aluminum oxide, aluminum oxynitride, aluminum nitride oxide, or the like. The insulating layer 993 can be formed by a sputtering method, a CVD method, a thermal oxidation method, a coating method, a printing method, or the like.

Figure 16A:
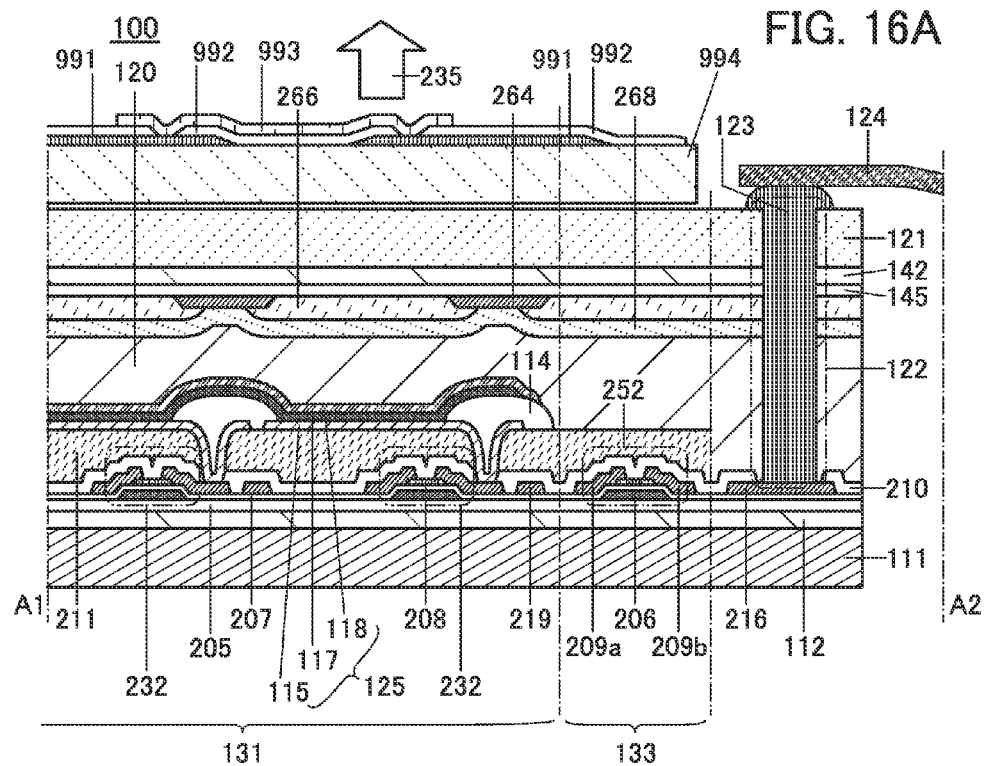
FIGS. 16A and 16B each illustrate one mode of a display device.

Note that the touch sensor may be formed using a substrate other than the substrate 121. FIG. 16A illustrates an example of the case where a touch sensor is formed using a substrate 994. Although the touch sensor is provided over the substrate 994, one embodiment of the present invention is not limited thereto. The touch sensor may be provided under the substrate 994 (i.e., between the substrate 121 and the substrate 994). In that case, the substrate 994 may be formed of tempered glass so that the display device can be protected from damage or the like.

Figure 15B:
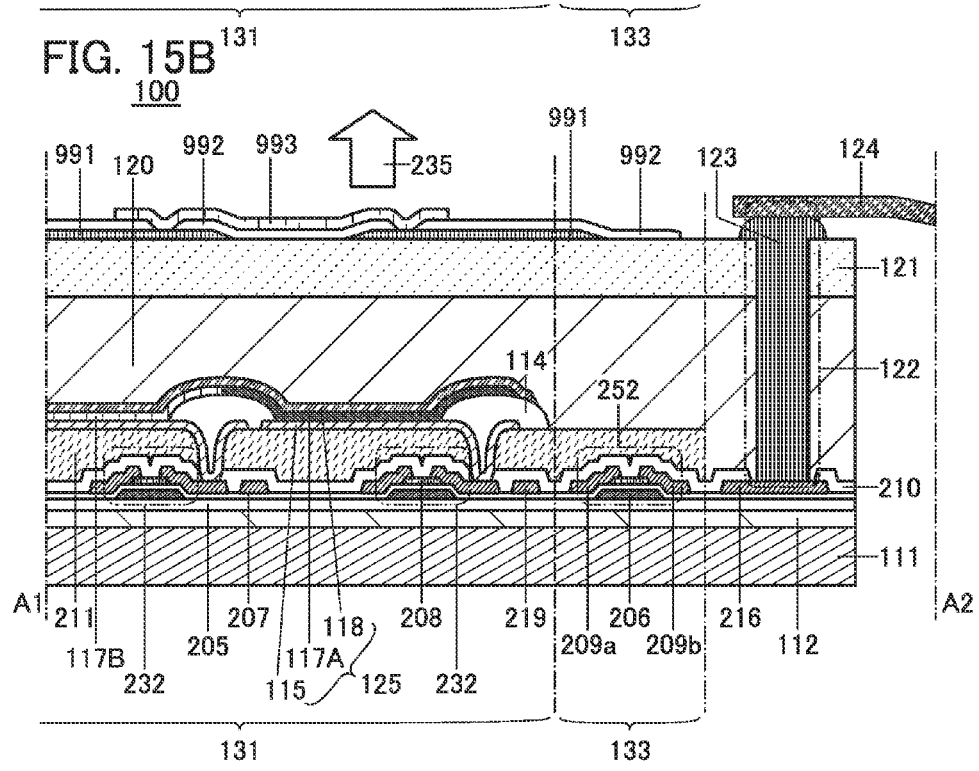
Figure 16B:
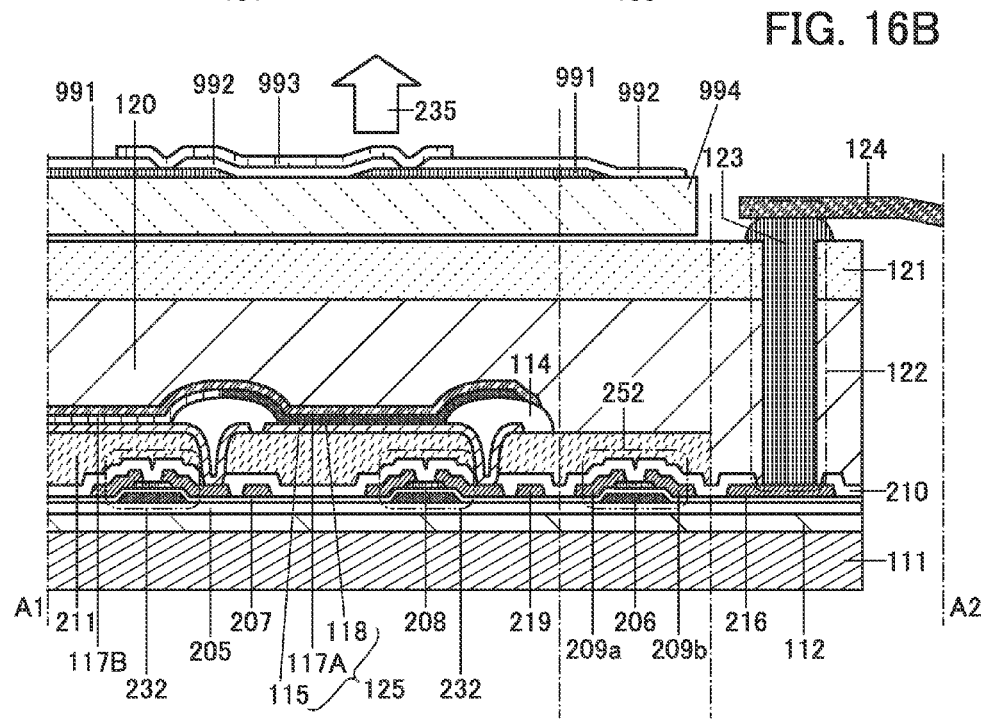
Figure 17A:
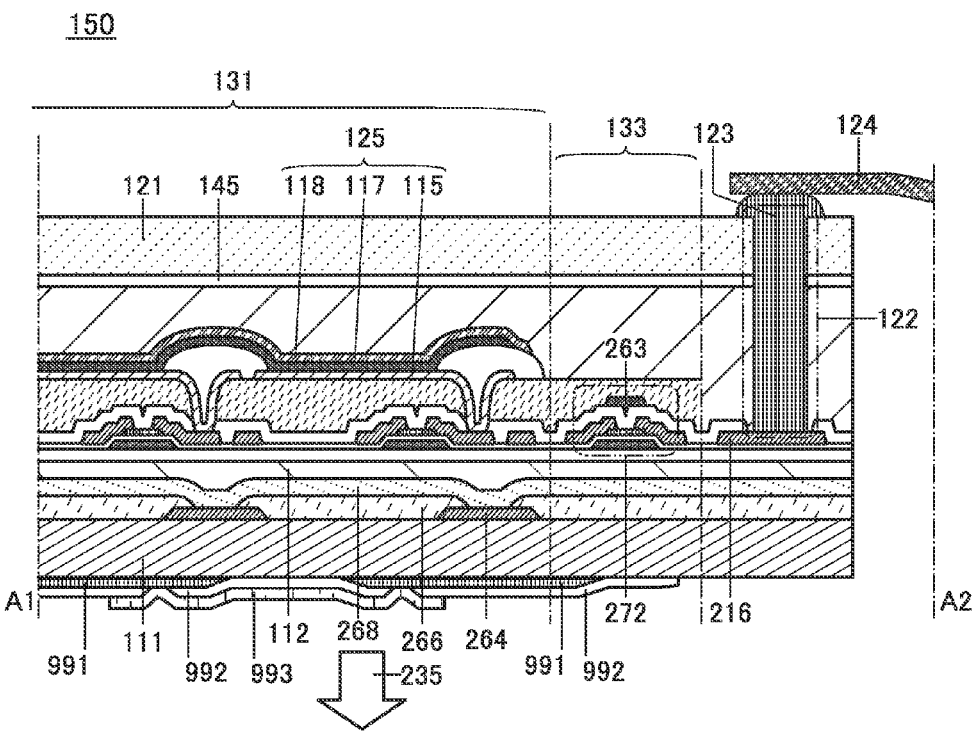
FIGS. 17A and 17B each illustrate one mode of a display device.
Figure 17B:
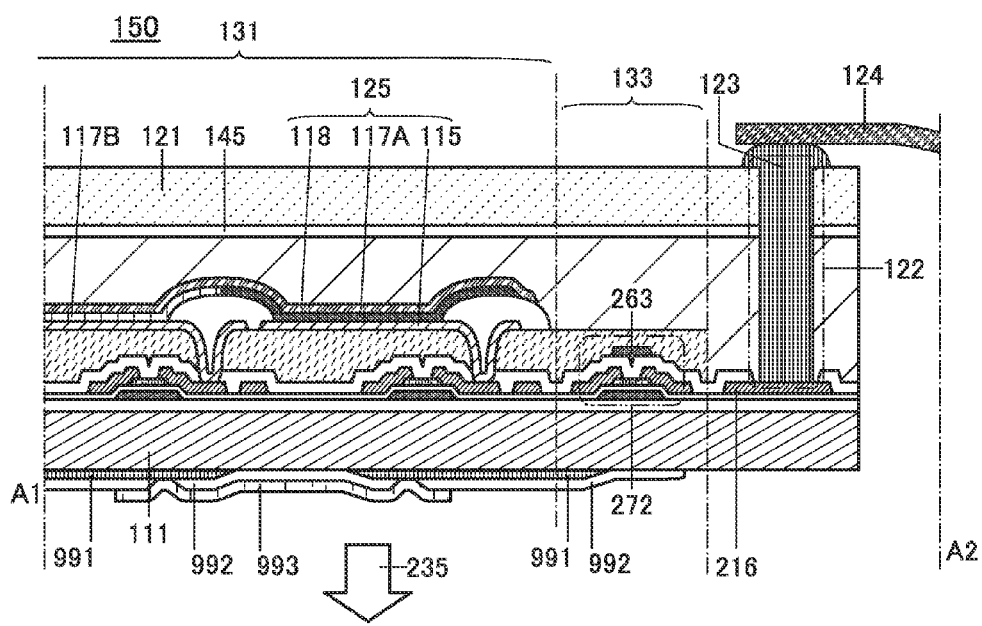
Figure 18A:
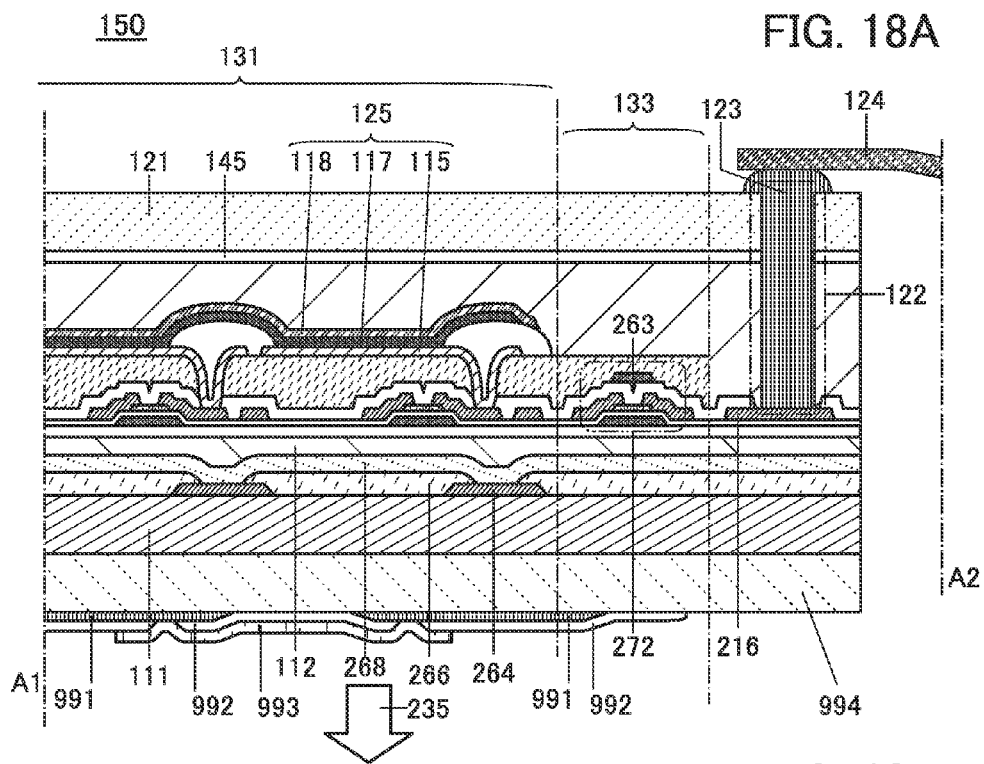
FIGS. 18A and 18B each illustrate one mode of a display device.
Figure 18B:
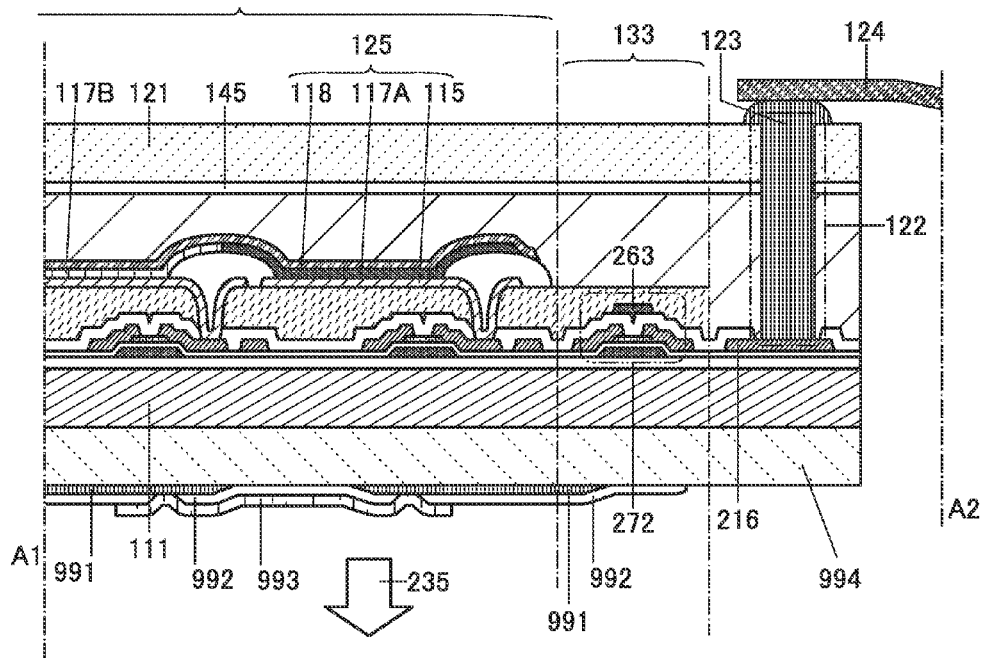

Note that the coloring layer 266, the light-blocking layer 264, the overcoat layer 268, and the like are not necessarily provided. In that case, color display can be performed with the use of an EL layer 117A, an EL layer 117B, and the like. The EL layer 117A, the EL layer 117B, and the like can emit light of the respective colors such as red, blue, and green. The non-use of the coloring layer 266 can improve the color purity and reduce the amount of light loss. FIG. 15B illustrates an example of the case where the coloring layer 266 and the like in FIG. 15A are not used, and FIG. 16B illustrates an example of the case where the coloring layer 266 and the like in FIG. 16A are not used.

<Example of Configuration of Pixel Circuit>

Figure 2A:
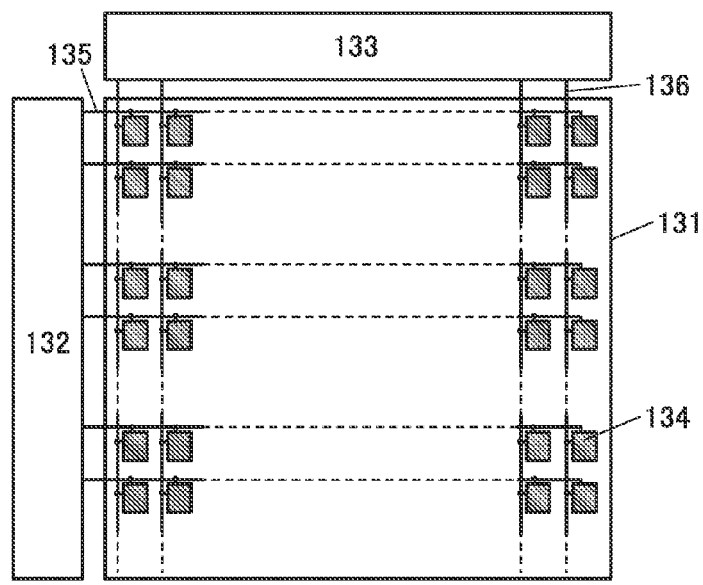
FIGS. 2A to 2C are a block diagram and circuit diagrams illustrating modes of display devices.

Here, a specific example of a configuration of the display device 100 is described with reference to FIGS. 2A to 2C. FIG. 2A is a block diagram illustrating the configuration of the display device 100. The display device 100 includes the display area 131, the driver circuit 132, and the driver circuit 133. The driver circuit 132 functions as, for example, a scan line driver circuit, and the driver circuit 133 functions as, for example, a signal line driver circuit.

The display device 100 includes m scan lines 135 which are arranged in parallel or substantially in parallel to each other and whose potentials are controlled by the driver circuit 132, and n signal lines 136 which are arranged in parallel or substantially in parallel to each other and whose potentials are controlled by the driver circuit 133. The display area 131 includes a plurality of pixels 134 arranged in a matrix. The driver circuit 132 and the driver circuit 133 may be collectively referred to as a driver circuit portion.

Each of the scan lines 135 is electrically connected to the n pixels 134 in the corresponding row among the pixels 134 arranged in m rows and n columns in the display area 131. Each of the signal lines 136 is electrically connected to the m pixels 134 in the corresponding column among the pixels 134 arranged in m rows and n columns. Note that m and n are each an integer of 1 or more.

Figure 2B:
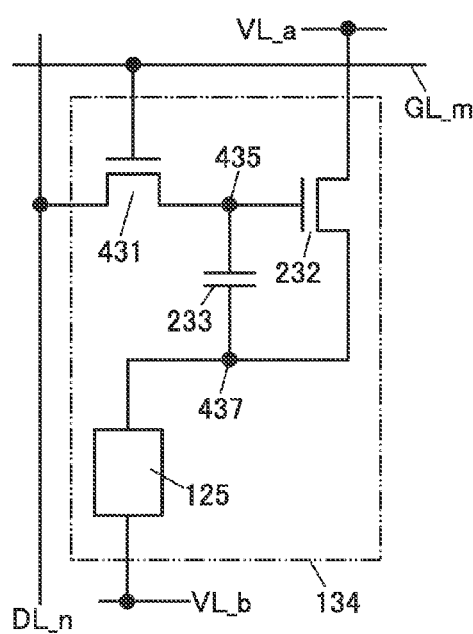
Figure 2C:
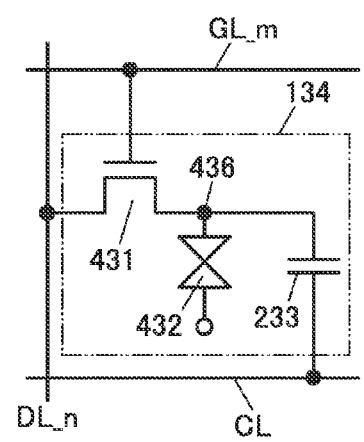

FIGS. 2B and 2C illustrate circuit configurations that can be used for the pixels 134 in the display device illustrated in FIG. 2A.

[Example of Pixel Circuit for Light-Emitting Display Device]

The pixel 134 illustrated in FIG. 2B includes a transistor 431, the capacitor 233, the transistor 232, and the light-emitting element 125.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m).

The transistor 431 has a function of controlling whether to write a data signal to a node 435 by being turned on or off.

One of a pair of electrodes of the capacitor 233 is electrically connected to the node 435, and the other is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to the potential supply line VL_a, and the other is electrically connected to the node 437. A gate electrode of the transistor 232 is electrically connected to the node 435.

One of an anode and a cathode of the light-emitting element 125 is electrically connected to a potential supply line VL_b, and the other is electrically connected to the node 437.

As the light-emitting element 125, an organic electroluminescent element (also referred to as an organic EL element) or the like can be used, for example. Note that the light-emitting element 125 is not limited thereto and may be an inorganic EL element containing an inorganic material.

Note that a high power supply potential VDD is supplied to one of the potential supply line VL_a and the potential supply line VL_b, and a low power supply potential VSS is supplied to the other.

In the display device including the pixel 134 in FIG. 2B, the pixels 134 are sequentially selected row by row by the first driver circuit 132, whereby the transistors 431 are turned on and a data signal is written to the nodes 435

When the transistors 431 are turned off, the pixels 134 in which the data has been written to the nodes 435 are brought into a holding state. The amount of current flowing between the source electrode and the drain electrode of the transistor 232 is controlled in accordance with the potential of the data written to the node 435. The light-emitting element 125 emits light with a luminance corresponding to the amount of flowing current. This operation is sequentially performed row by row; thus, an image is displayed.

[Example of Pixel Circuit for Liquid Crystal Display Device]

The pixel 134 illustrated in FIG. 2C includes a liquid crystal element 432, the transistor 431, and the capacitor 233.

The potential of one of a pair of electrodes of the liquid crystal element 432 is set according to the specifications of the pixels 134 as appropriate. The alignment state of the liquid crystal element 432 depends on data written to a node 436. A common potential may be applied to one of the pair of electrodes of the liquid crystal element 432 included in each of the plurality of pixels 134. The potential supplied to one of a pair of electrodes of the liquid crystal element 432 in the pixel 134 in one row may be different from the potential supplied to one of a pair of electrodes of the liquid crystal element 432 in the pixel 134 in another row.

Examples of a driving method of the display device including the liquid crystal element 432 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

The liquid crystal element 432 may be formed using a liquid crystal composition including liquid crystal exhibiting a blue phase and a chiral material. Liquid crystal exhibiting a blue phase does not need alignment treatment. In addition, the liquid crystal exhibiting a blue phase has a short response time of 1 msec or less and is optically isotropic, which makes the viewing angle dependence small.

Note that a display element other than the light-emitting element 125 and the liquid crystal element 432 can be used. For example, an electrophoretic element, an electronic ink, an electrowetting element, a micro electro mechanical system (MEMS), a digital micromirror device (DMD), a digital micro shutter (DMS), MIRASOL (registered trademark), an interferometric modulator (IMOD) element, or the like can be used as the display element.

In the pixel 134 in the m-th row and the n-th column, one of a source electrode and a drain electrode of the transistor 431 is electrically connected to a signal line DL_n, and the other is electrically connected to the node 436. A gate electrode of the transistor 431 is electrically connected to a scan line GL_m. The transistor 431 has a function of controlling whether to write a data signal to the node 436 by being turned on or off.

One of a pair of electrodes of the capacitor 233 is electrically connected to a wiring to which a particular potential is supplied (hereinafter referred to as a capacitor line CL), and the other is electrically connected to the node 436. The other of the pair of electrodes of the liquid crystal element 432 is electrically connected to the node 436. The potential of the capacitor line CL is set in accordance with the specifications of the pixel 134 as appropriate. The capacitor 233 functions as a storage capacitor for storing data written to the node 436.

For example, in the display device including the pixel 134 in FIG. 2C, the pixels 134 are sequentially selected row by row by the first driver circuit 132, whereby the transistors 431 are turned on and a data signal is written to the nodes 436.

When the transistors 431 are turned off, the pixels 134 in which the data signal has been written to the nodes 436 are brought into a holding state. This operation is sequentially performed row by row; thus, an image is displayed.

<Example of how to Bend Display Device>

Figure 3A:
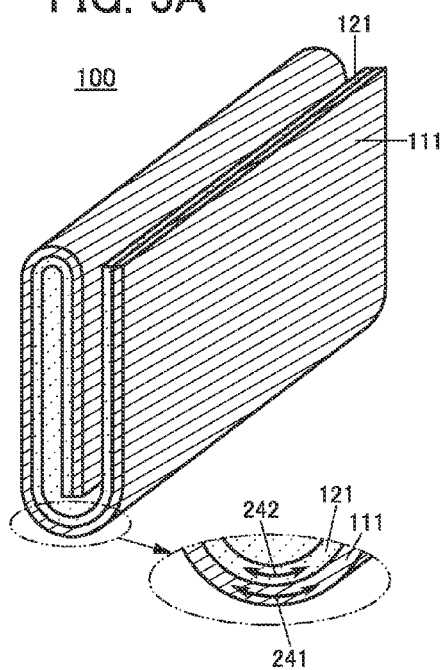
FIGS. 3A to 3C illustrate examples of states in which a display device is bent.
Figure 3B:
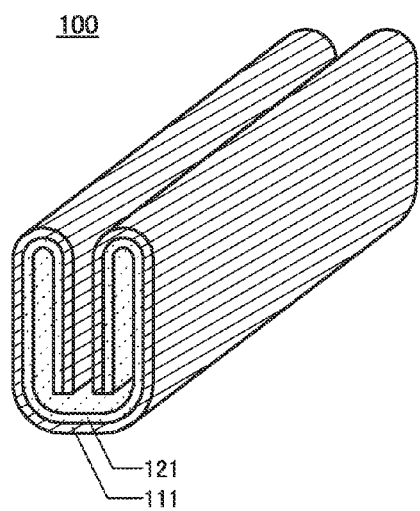
Figure 3C:
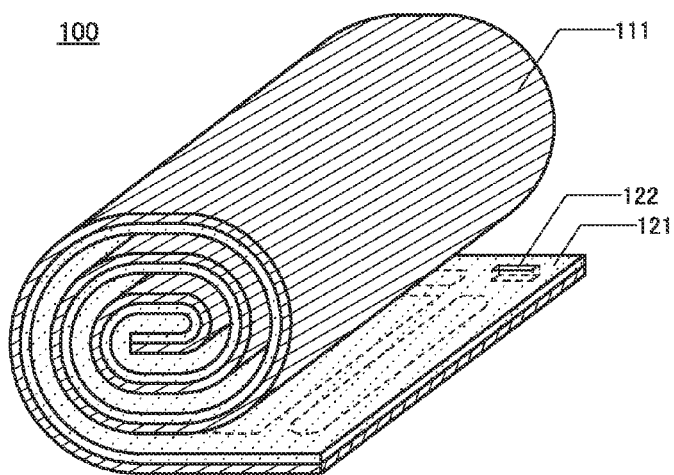

The display device 100 of one embodiment of the present invention is fabricated using flexible substrates. This enables the display device 100 to be curved or bent freely. Thus, the display device 100 can be rolled or folded freely. FIG. 3A is a perspective view illustrating a state in which the display device 100 is folded in thirds. FIG. 3B is a perspective view illustrating a state in which the gate-fold display device 100 is folded in halves. FIG. 3C is a perspective view illustrating a state in which the display device 100 is rolled. Note that the external electrode 124 is not illustrated in FIGS. 3A to 3C.

As illustrated in FIGS. 3A to 3C, the display device 100 can be folded freely, and is thus stored easily and highly portable. It is preferable that the display device 100 be curved or bent (hereinafter, also simply referred to as "bent") so that the substrate 121 is positioned on the inner side (the valley side) and the substrate 111 is positioned on the outer side (the mountain side). FIGS. 3A to 3C each illustrate an example in which the display device 100 is bent so that the substrate 111 is positioned on the outer side.

In a bend portion of the display device 100, mechanical stress due to a bend is applied to the substrate 121 and the substrate 111. As for the mechanical stress due to the bend, stress 241 applied to the substrate positioned on the outer side in the bend portion is higher than stress 242 on the substrate positioned on the inner side in the bend portion.

Over the substrate 111 of the display device 100 disclosed in this embodiment, transistors are formed in a matrix and wirings for supplying signals to the transistors are formed in a grid pattern. In addition, a plurality of insulating layers are formed. The substrate 111 provided with the wirings, the insulating layers, and the like has higher mechanical strength than the substrate 121.

Thus, when the display device 100 is bent so that the substrate 111 is positioned on the outer side (the mountain side) in the bend portion, the display device 100 is less likely to be broken even when repeatedly bent and extended. Thus, the display device 100 can have high reliability.

The display device 100 is bendable and is thus less likely to be broken even when dropped; therefore, a durable display device can be provided.

Note that in the case of a display device having a top-emission structure, light is emitted toward the inside of the bend portion. Thus, an emission surface is positioned inside when the display device is bent. This can protect the emission surface. Light is prevented from being emitted when the display device is bent, so that power consumption can be reduced.

Meanwhile, in the case of a display device having a bottom-emission structure, light is emitted toward the outside of the bend portion. This enables display to be seen even when the display device is bent. Light is prevented from being emitted in a region that cannot be seen because of a bend of the display device, so that power consumption can be reduced.

Figure 19A:
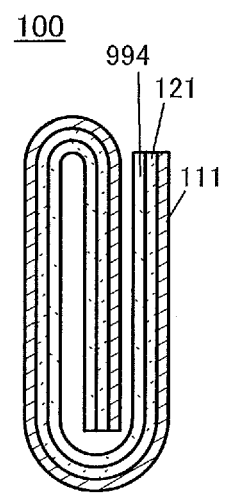
FIGS. 19A and 19B illustrate examples of cross sections of states in which a display device is bent.
Figure 19B:
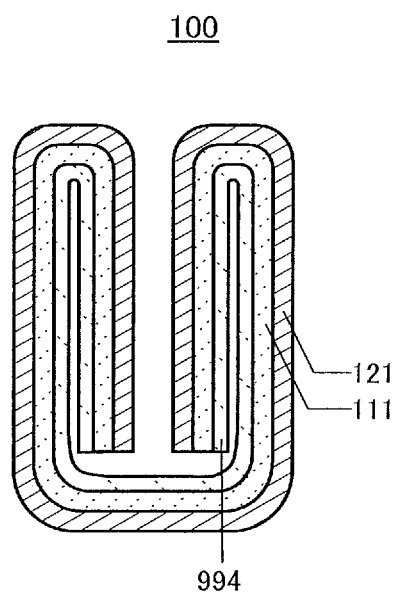

FIGS. 19A and 19B are cross-sectional views each illustrating the case where a substrate 994 is provided as a substrate for a touch sensor or a protective substrate over the substrate 121, that is, the case of a top-emission structure. This placement enables the display device 100 to be less likely to be broken; thus, the reliability of the display device 100 can be improved.

Note that in the case where the substrate 994 is provided as a substrate for a touch sensor or a protective substrate under the substrate 111, that is, in the case of a bottom-emission structure, the substrate 111, the substrate 121, and the substrate 994 in the cross-sectional views of FIGS. 19A and 19B are replaced by the substrate 994, the substrate 111, and the substrate 121, respectively.

This embodiment can be implemented in an appropriate combination with any of the structures described in the other embodiments.

Embodiment 2

In this embodiment, an example of a method for fabricating a display device 100 is described with reference to FIGS. 4A to 4D, FIGS. 5A to 5D, FIGS. 6A and 6B, and FIGS. 7A and 7B. Note that FIGS. 4A to 4D, FIGS. 5A to 5D, FIGS. 6A and 6B, and FIGS. 7A and 7B are cross-sectional views taken along the dashed-dotted line A1-A2 in FIG. 1A.

[Formation of Separation Layer]

Figure 4A:
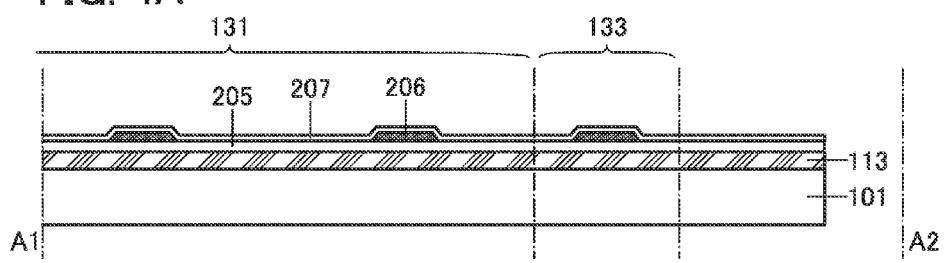
FIGS. 4A to 4D are cross-sectional views illustrating an example of a method for fabricating a display device.
Figure 4B:
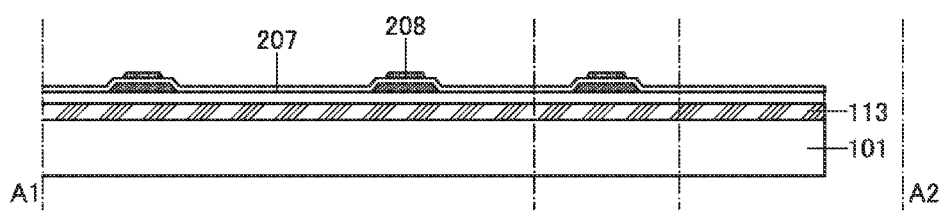
Figure 4C:
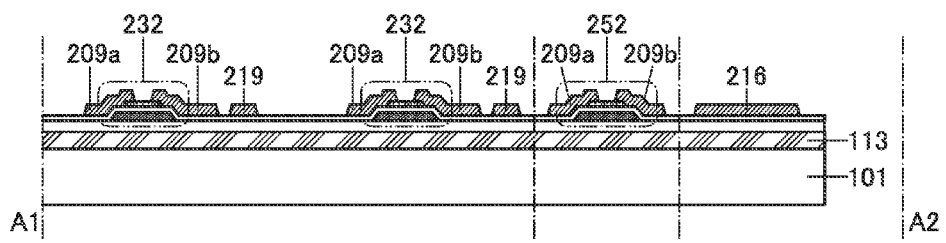
Figure 4D:
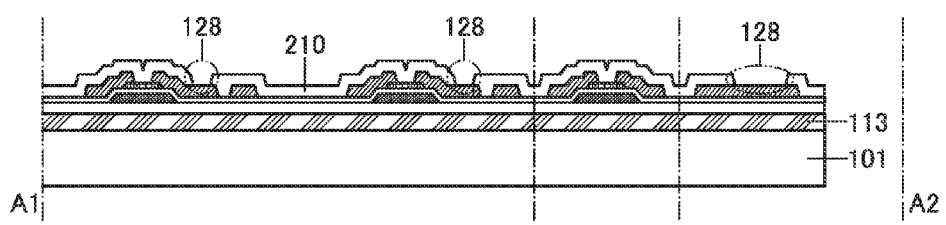

First, a separation layer 113 is formed over an element formation substrate 101 (see FIG. 4A). Note that the element formation substrate 101 may be a glass substrate, a quartz substrate, a sapphire substrate, a ceramic substrate, a metal substrate, or the like. Alternatively, a plastic substrate having heat resistance to the processing temperature of this embodiment may be used.

As the glass substrate, for example, a glass material such as aluminosilicate glass, aluminoborosilicate glass, or barium borosilicate glass is used. Note that when the glass substrate contains a large amount of barium oxide (BaO), the glass substrate can be heat-resistant and more practical. Alternatively, crystallized glass or the like may be used.

The separation layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The separation layer 113 can also be formed to have a single-layer structure or a stacked-layer structure using any of the materials. Note that the crystalline structure of the separation layer 113 may be amorphous, microcrystalline, or polycrystalline. The separation layer 113 can also be formed using a metal oxide such as aluminum oxide, gallium oxide, zinc oxide, titanium dioxide, indium oxide, indium tin oxide, indium zinc oxide, or InGaZnO (IGZO).

The separation layer 113 can be formed by a sputtering method, a CVD method, a coating method, a printing method, or the like. Note that the coating method includes a spin coating method, a droplet discharge method, and a dispensing method.

In the case where the separation layer 113 has a single-layer structure, the separation layer 113 is preferably formed using tungsten, molybdenum, or a tungsten-molybdenum alloy. Alternatively, the separation layer 113 is preferably formed using an oxide or oxynitride of tungsten, an oxide or oxynitride of molybdenum, or an oxide or oxynitride of a tungsten-molybdenum alloy.

In the case where the separation layer 113 has a stacked-layer structure including, for example, a layer containing tungsten and a layer containing an oxide of tungsten, the layer containing an oxide of tungsten may be formed as follows: the layer containing tungsten is formed first and then an oxide insulating layer is formed in contact therewith, so that the layer containing an oxide of tungsten is formed at the interface between the layer containing tungsten and the oxide insulating layer. Alternatively, the layer containing an oxide of tungsten may be formed by performing thermal oxidation treatment, oxygen plasma treatment, treatment with a highly oxidizing solution such as ozone water, or the like on the surface of the layer containing tungsten.

In this embodiment, the separation layer 113 is formed of tungsten by a sputtering method.

[Formation of Insulating Layer]

Next, the insulating layer 205 is formed as a base layer over the separation layer 113 (see FIG. 4A). The insulating layer 205 is preferably formed as a single layer or a multilayer using silicon oxide, silicon nitride, silicon oxynitride, silicon nitride oxide, aluminum oxide, aluminum oxynitride, aluminum nitride oxide, or the like. The insulating layer 205 may have, for example, a two-layer structure of silicon oxide and silicon nitride or a five-layer structure in which materials selected from the above are combined. The insulating layer 205 can be formed by a sputtering method, a CVD method, a thermal oxidation method, a coating method, a printing method, or the like.

The thickness of the insulating layer 205 may be greater than or equal to 30 nm and less than or equal to 500 nm, preferably greater than or equal to 50 nm and less than or equal to 400 nm.

The insulating layer 205 can prevent or reduce diffusion of impurity elements from the element formation substrate 101, the separation layer 113, or the like. Even after the element formation substrate 101 is replaced by the substrate 111, the insulating layer 205 can prevent or reduce diffusion of impurity elements into the light-emitting element 125 from the substrate 111, the bonding layer 112, or the like. In this embodiment, the insulating layer 205 is formed by stacking a 200-nm-thick silicon oxynitride film and a 50-nm-thick silicon nitride oxide film by a plasma CVD method.

[Formation of Gate Electrode]

Next, a gate electrode 206 is formed over the insulating layer 205 (see FIG. 4A). The gate electrode 206 may be formed using a metal element selected from aluminum, chromium, copper, tantalum, titanium, molybdenum, and tungsten; an alloy containing any of these metal elements as a component; an alloy containing any of these metal elements in combination; or the like. The gate electrode 206 can be formed using a metal selected from aluminum, chromium, copper, tantalum, titanium, molybdenum, and tungsten; an alloy containing any of these metals as a component; an alloy containing any of these metals in combination; or the like. Alternatively, one or more metal elements selected from manganese and zirconium may be used. The gate electrode 206 may have a single-layer structure or a stacked structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 206 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

First, a conductive film to be the gate electrode 206 is stacked over the insulating layer 205 by a sputtering method, a CVD method, an evaporation method, or the like, and a resist mask is formed over the conductive film by a photolithography process. Next, part of the conductive film to be the gate electrode 206 is etched with the use of the resist mask to form the gate electrode 206. At the same time, a wiring and another electrode can be formed.

The conductive film may be etched by a dry etching method, a wet etching method, or both a dry etching method and a wet etching method. Note that in the case where the conductive film is etched by a dry etching method, ashing treatment may be performed before the resist mask is removed, whereby the resist mask can be easily removed with a stripper.

Note that the gate electrode 206 may be formed by an electrolytic plating method, a printing method, an inkjet method, or the like instead of the above formation method.

The thickness of the gate electrode 206 is greater than or equal to 5 nm and less than or equal to 500 nm, preferably greater than or equal to 10 nm and less than or equal to 300 nm, more preferably greater than or equal to 10 nm and less than or equal to 200 nm.

The gate electrode 206 may be formed using a light-blocking conductive material, whereby external light can be prevented from reaching the semiconductor layer 208 from the gate electrode 206 side. As a result, a variation in electrical characteristics of the transistor due to light irradiation can be suppressed.

[Formation of Gate Insulating Layer]

Next, the gate insulating layer 207 is formed (see FIG. 4A). The gate insulating layer 207 can be formed to have a single-layer structure or a stacked-layer structure using, for example, any of silicon oxide, silicon oxynitride, silicon nitride oxide, silicon nitride, aluminum oxide, a mixture of aluminum oxide and silicon oxide, hafnium oxide, gallium oxide, Ga—Zn-based metal oxide, silicon nitride, and the like.

The gate insulating layer 207 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced. For example, a stack of silicon oxynitride and hafnium oxide may be used.

The thickness of the gate insulating layer 207 is greater than or equal to 5 nm and less than or equal to 400 nm, preferably greater than or equal to 10 nm and less than or equal to 300 nm, more preferably greater than or equal to 50 nm and less than or equal to 250 nm.

The gate insulating layer 207 can be formed by a sputtering method, a CVD method, an evaporation method, or the like.

In the case where a silicon oxide film, a silicon oxynitride film, or a silicon nitride oxide film is formed as the gate insulating layer 207, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

The gate insulating layer 207 can have a stacked-layer structure in which a nitride insulating layer and an oxide insulating layer are stacked in this order from the gate electrode 206 side. When the nitride insulating layer is provided on the gate electrode 206 side, hydrogen, nitrogen, an alkali metal, an alkaline earth metal, or the like can be prevented from moving from the gate electrode 206 side to the semiconductor layer 208. Note that nitrogen, an alkali metal, an alkaline earth metal, or the like generally serves as an impurity element of a semiconductor. In addition, hydrogen serves as an impurity element of an oxide semiconductor. Thus, an "impurity" in this specification and the like includes hydrogen, nitrogen, an alkali metal, an alkaline earth metal, or the like.

In the case where an oxide semiconductor is used for the semiconductor layer 208, the density of defect states at the interface between the gate insulating layer 207 and the semiconductor layer 208 can be reduced by providing the oxide insulating layer on the semiconductor layer 208 side. Consequently, a transistor whose electrical characteristics are hardly degraded can be obtained. Note that in the case where an oxide semiconductor is used for the semiconductor layer 208, an oxide insulating layer containing oxygen in a proportion higher than that in the stoichiometric composition is preferably formed as the oxide insulating layer. This is because the density of defect states at the interface between the gate insulating layer 207 and the semiconductor layer 208 can be further reduced.

In the case where the gate insulating layer 207 is the stack of the nitride insulating layer and the oxide insulating layer as described above, the nitride insulating layer is preferably thicker than the oxide insulating layer.

The nitride insulating layer has a dielectric constant higher than that of the oxide insulating layer, thus, an electric field generated from the gate electrode 206 can be efficiently transmitted to the semiconductor layer 208 even when the gate insulating layer 207 has a large thickness. When the gate insulating layer 207 has a large total thickness, the withstand voltage of the gate insulating layer 207 can be increased. Accordingly, the reliability of the display device can be improved.

The gate insulating layer 207 can have a stacked-layer structure in which a first nitride insulating layer with few defects, a second nitride insulating layer with a high blocking property against hydrogen, and an oxide insulating layer are stacked in this order from the gate electrode 206 side. When the first nitride insulating layer with few defects is used in the gate insulating layer 207, the withstand voltage of the gate insulating layer 207 can be improved. In addition, when the second nitride insulating layer with a high blocking property against hydrogen is used in the gate insulating layer 207, hydrogen contained in the gate electrode 206 and the first nitride insulating layer can be prevented from moving to the semiconductor layer 208.

An example of a method for forming the first and second nitride insulating layers is described below. First, a silicon nitride film with few defects is formed as the first nitride insulating layer by a plasma CVD method in which a mixed gas of silane, nitrogen, and ammonia is used as a source gas. Next, a silicon nitride film in which the hydrogen concentration is low and hydrogen can be blocked is formed as the second nitride insulating layer by switching the source gas to a mixed gas of silane and nitrogen. By such a formation method, the gate insulating layer 207 in which nitride insulating layers with few defects and a blocking property against hydrogen are stacked can be formed.

The gate insulating layer 207 can have a stacked-layer structure in which a third nitride insulating film with a high blocking property against impurities, the first nitride insulating layer with few defects, the second nitride insulating layer with a high blocking property against hydrogen, and the oxide insulating layer are stacked in this order from the gate electrode 206 side. When the third nitride insulating layer with a high blocking property against impurities is provided in the gate insulating layer 207, hydrogen, nitrogen, an alkali metal, an alkaline earth metal, or the like can be prevented from moving from the gate electrode 206 to the semiconductor layer 208.

An example of a method for forming the first to third nitride insulating layers is described below. First, a silicon nitride film with a high blocking property against an impurity is formed as the third nitride insulating layer by a plasma CVD method in which a mixed gas of silane, nitrogen, and ammonia is used as a source gas. Next, a silicon nitride film with few defects is formed as the first nitride insulating layer by increasing the flow rate of ammonia. Next, a silicon nitride film in which the hydrogen concentration is low and hydrogen can be blocked is formed as the second nitride insulating layer by switching the source gas to a mixed gas of silane and nitrogen. By such a formation method, the gate insulating layer 207 in which nitride insulating layers with few defects and a blocking property against an impurity are stacked can be formed.

Moreover, in the case of forming a gallium oxide film as the gate insulating layer 207, a metal organic chemical vapor deposition (MOCVD) method can be employed.

Note that the threshold voltage of a transistor can be changed by stacking the semiconductor layer 208 in which a channel of the transistor is formed and an insulating layer containing hafnium oxide with an oxide insulating layer therebetween and injecting electrons into the insulating layer containing hafnium oxide.

[Formation of Semiconductor Layer]

As described above, the semiconductor layer 208 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

The thickness of the semiconductor layer 208 is greater than or equal to 3 nm and less than or equal to 200 nm, preferably greater than or equal to 3 nm and less than or equal to 100 nm, more preferably greater than or equal to 3 nm and less than or equal to 50 nm. In this embodiment, as the semiconductor layer 208, an oxide semiconductor film with a thickness of 30 nm is formed by a sputtering method.

Next, a resist mask is formed over the oxide semiconductor film, and part of the oxide semiconductor film is selectively etched using the resist mask to form the semiconductor layer 208. The resist mask can be formed by a photolithography method, a printing method, an inkjet method, or the like as appropriate. Formation of the resist mask by an inkjet method needs no photomask; thus, fabrication cost can be reduced.

Note that the etching of the oxide semiconductor film may be performed by either one or both of a dry etching method and a wet etching method. After the etching of the oxide semiconductor film, the resist mask is removed (see FIG. 4B).

[Formation of Source Electrode, Drain Electrode, and the Like]

Next, the source electrode 209a, the drain electrode 209b, the wiring 219, and the terminal electrode 216 are formed. First, a conductive film is formed over the gate insulating layer 207 and the semiconductor layer 208.

The conductive film can have a single-layer structure or a stacked-layer structure containing any of metals such as aluminum, titanium, chromium, nickel, copper, yttrium, zirconium, molybdenum, silver, tantalum, and tungsten or an alloy containing any of these metals as its main component. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and a three-layer structure in which a tungsten film, a copper film, and a tungsten film are stacked in this order.

Note that a conductive material containing oxygen such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen such as titanium nitride or tantalum nitride may be used. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen.

The thickness of the conductive film is greater than or equal to 5 nm and less than or equal to 500 nm, preferably greater than or equal to 10 nm and less than or equal to 300 nm, more preferably greater than or equal to 10 nm and less than or equal to 200 nm. In this embodiment, a 300-nm-thick tungsten film is formed as the conductive film.

Then, part of the conductive film is selectively etched using a resist mask to form the source electrode 209a, the drain electrode 209b, the wiring 219, and the terminal electrode 216 (including other electrodes and wirings formed using the same film). The resist mask can be formed by a photolithography method, a printing method, an inkjet method, or the like as appropriate. Formation of the resist mask by an inkjet method needs no photomask thus, fabrication cost can be reduced.

The conductive film may be etched by a dry etching method, a wet etching method, or both a dry etching method and a wet etching method. Note that an exposed portion of the semiconductor layer 208 may be removed by the etching step in some cases.

The conductive film may be etched by a dry etching method, a wet etching method, or both a dry etching method and a wet etching method. After the etching of the conductive film, the resist mask is removed (see FIG. 4C).

[Formation of Insulating Layer]

Next, the insulating layer 210 is formed over the source electrode 209a, the drain electrode 209b, the wiring 219, and the terminal electrode 216. The insulating layer 210 can be formed using a material and a method similar to those of the insulating layer 205.

In the case where an oxide semiconductor is used for the semiconductor layer 208, an insulating layer containing oxygen is preferably used for at least part of the insulating layer 210 that is in contact with the semiconductor layer 208. For example, in the case where the insulating layer 210 is a stack of a plurality of layers, at least a layer that is in contact with the semiconductor layer 208 is preferably formed using silicon oxide.

[Formation of Opening]

Next, part of the insulating layer 210 is selectively etched using a resist mask to form an opening 128. At the same time, another opening that is not illustrated is also formed. The resist mask can be formed by a photolithography method, a printing method, an inkjet method, or the like as appropriate. Formation of the resist mask by an inkjet method needs no photomask; thus, fabrication cost can be reduced.

The conductive film may be etched by a dry etching method, a wet etching method, or both a dry etching method and a wet etching method. Note that an exposed portion of the semiconductor layer 208 may be removed by the etching step in some cases.

The drain electrode 209b and the terminal electrode 216 are partly exposed by the formation of the opening 128. The resist mask is removed after the formation of the opening 128.

[Formation of Planarization Film]

Next, the insulating layer 211 is formed over the insulating layer 210. The insulating layer 211 can be formed using a material and a method similar to those of the insulating layer 205.

Planarization treatment may be performed on the insulating layer 211 to reduce unevenness of a surface on which the light-emitting element 125 is formed. The planarization treatment may be, but not particularly limited to, polishing treatment (e.g., chemical mechanical polishing (CMP)) or dry etching treatment.

Forming the insulating layer 211 using an insulating material with a planarization function can make polishing treatment unnecessary. As the insulating material with a planarization function, for example, an organic material such as a polyimide resin or an acrylic resin can be used. Besides such organic materials, a low-dielectric constant material (a low-k material) or the like can be used. Note that the insulating layer 211 may be formed by stacking a plurality of insulating layers formed of any of these materials.

Part of the insulating layer 211 that overlaps the opening 128 is removed to form an opening 129. At the same time, another opening that is not illustrated is also formed. In addition, the insulating layer 211 in a region to which the external electrode 124 is connected later is removed. Note that the opening 129 or the like can be formed in such a manner that a resist mask is formed by a photolithography process over the insulating layer 211 and a region of the insulating layer 211 that is not covered with the resist mask is etched (see FIG. 5A). A surface of the drain electrode 209b is exposed by the formation of the opening 129.

When the insulating layer 211 is formed using a photosensitive material, the opening 129 can be formed without the resist mask. In this embodiment, a photosensitive polyimide resin is used to form the insulating layer 211 and the opening 129.

[Formation of Anode]

Next, the electrode 115 is formed over the insulating layer 211 (see FIG. 5B). The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, having a work function higher than that of the EL layer 117, and a layer having high reflectance (e.g., aluminum, an alloy containing aluminum, or silver) may be provided in contact with the layer.

Note that although the display device having a top-emission structure is described as an example in this embodiment, a display device having a bottom-emission structure or a dual-emission structure may be used.

In the case where the display device 100 has a bottom-emission structure or a dual-emission structure, the electrode 115 is preferably formed using a light-transmitting conductive material.

The electrode 115 can be formed in such a manner that a conductive film to be the electrode 115 is formed over the insulating layer 211, a resist mask is formed over the conductive film, and a region of the conductive film that is not covered with the resist mask is etched. The conductive film can be etched by a dry etching method, a wet etching method, or both a dry etching method and a wet etching method. The resist mask can be formed by a photolithography method, a printing method, an inkjet method, or the like as appropriate. Formation of the resist mask by an inkjet method needs no photomask; thus, fabrication cost can be reduced. The resist mask is removed after the formation of the electrode 115.

[Formation of Partition]

Next, the partition 114 is formed (see FIG. 5C). The partition 114 is provided in order to prevent an unintended electrical short-circuit between light-emitting elements 125 in adjacent pixels and unintended light emission from the light-emitting element 125. In the case of using a metal mask for formation of the EL layer 117 described later, the partition 114 has a function of preventing the contact of the metal mask with the electrode 115. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[Formation of EL Layer]

A structure of the EL layer 117 is described in Embodiment 4.

[Formation of Cathode]

The electrode 118 is used as a cathode in this embodiment, and thus is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118.

In the case where light emitted from the EL layer 117 is extracted through the electrode 118, the electrode 118 preferably has a property of transmitting visible light. The light-emitting element 125 includes the electrode 115, the EL layer 117, and the electrode 118 (see FIG. 5D).

[Formation of Counter Element Formation Substrate]

Figure 6A:
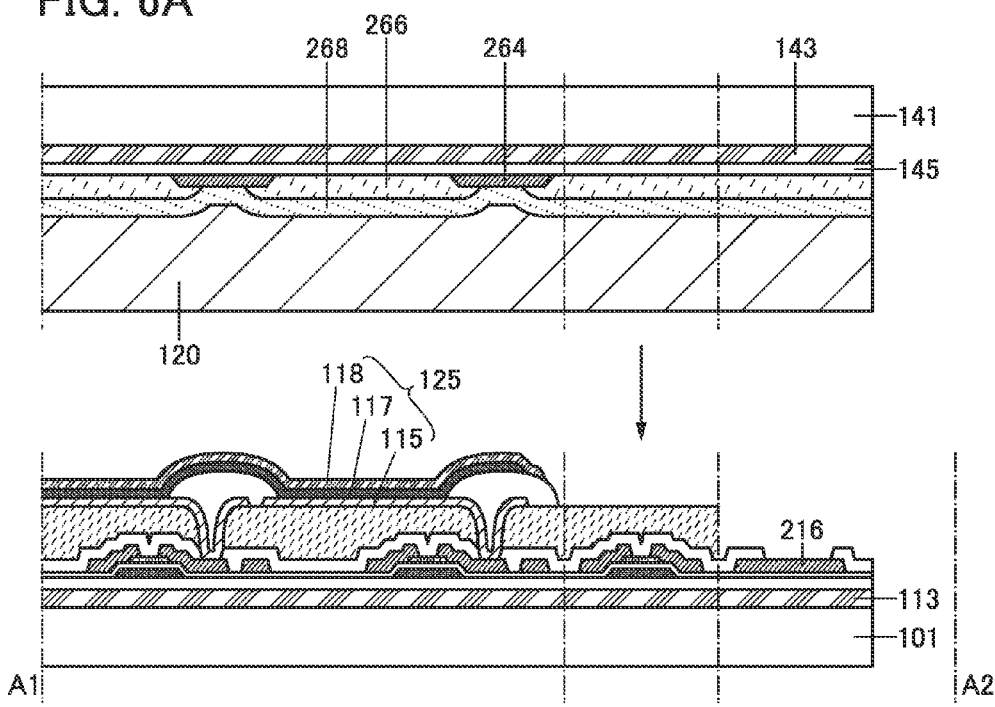
FIGS. 6A and 6B are cross-sectional views illustrating an example of a method for fabricating a display device.

An element formation substrate 141 provided with the light-blocking layer 264, the coloring layer 266, the overcoat layer 268, the insulating layer 145, and a separation layer 143 is formed over the element formation substrate 101 with the bonding layer 120 therebetween (see FIG. 6A). Note that the element formation substrate 141 is formed to face the element formation substrate 101 and may thus be called a "counter element formation substrate". A structure of the element formation substrate 141 (counter element formation substrate) is described later.

The bonding layer 120 is in contact with the electrode 118. The element formation substrate 141 is fixed by the bonding layer 120. A light curable adhesive, a reactive curable adhesive, a thermosetting adhesive, or an anaerobic adhesive can be used as the bonding layer 120. For example, an epoxy resin, an acrylic resin, or an imide resin can be used. In a top-emission structure, a drying agent (e.g., zeolite) having a size less than or equal to the wavelength of light or a filler (e.g., titanium oxide or zirconium) with a high refractive index is preferably mixed into the bonding layer 120, in which case the efficiency of extracting light emitted from the EL layer 117 can be improved.

[Separation of Element Formation Substrate from Insulating Layer]

Figure 6B:
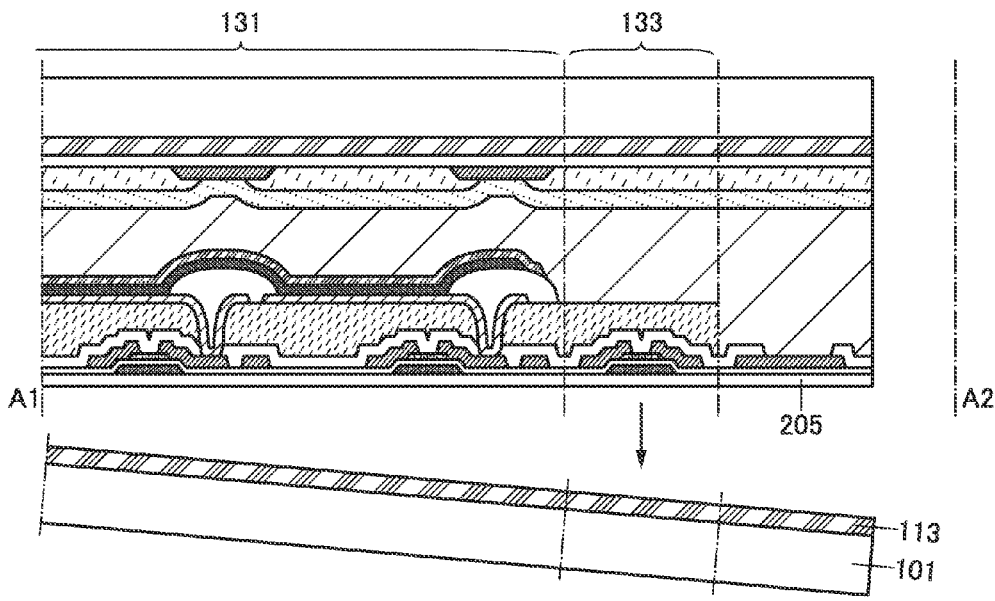

Next, the element formation substrate 101 attached to the insulating layer 205 with the separation layer 113 therebetween is separated from the insulating layer 205 (see FIG. 6B). As a separation method, mechanical force (a separation process with a human hand or a gripper, a separation process by rotation of a roller, ultrasonic waves, or the like) may be used. For example, a cut is made in the separation layer 113 with a sharp edged tool, by laser light irradiation, or the like and water is injected into the cut. Alternatively, the cut is sprayed with a mist of water. A portion between the separation layer 113 and the insulating layer 205 absorbs water through capillarity action, so that the element formation substrate 101 can be separated easily from the insulating layer 205.

[Bonding of Substrate]

Figure 7A:
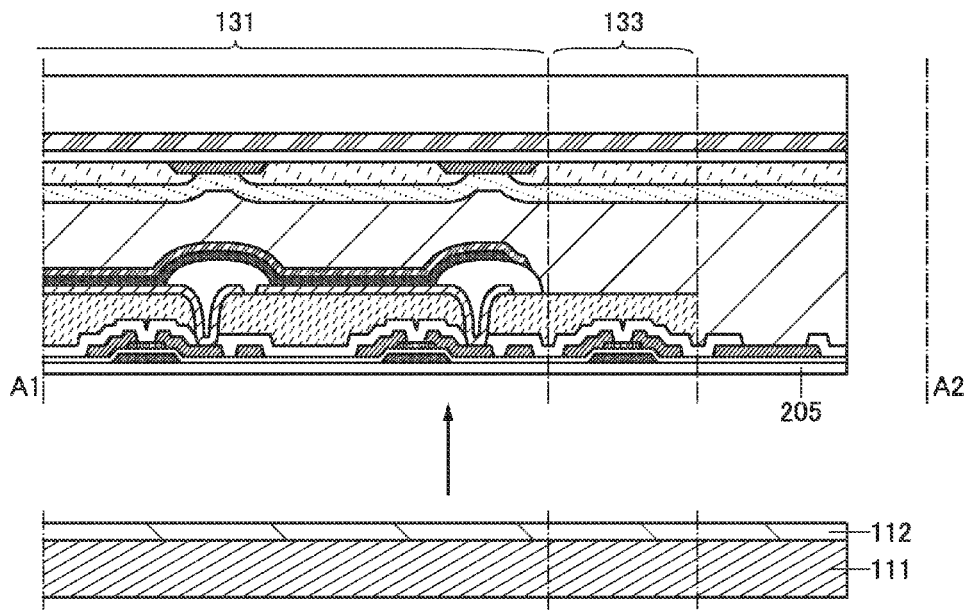
FIGS. 7A and 7B are cross-sectional views illustrating an example of a method for fabricating a display device.
Figure 7B:
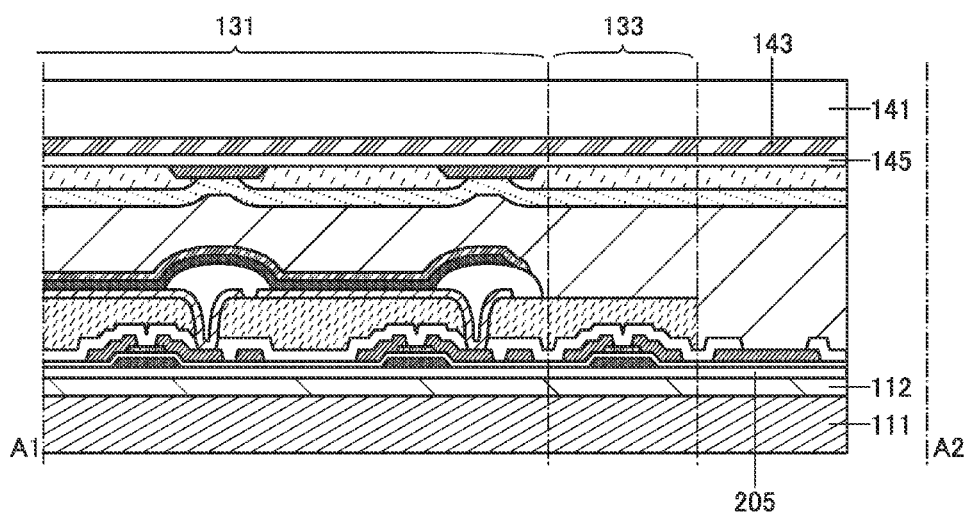

Next, the substrate 111 is attached to the insulating layer 205 with the bonding layer 112 therebetween (see FIGS. 7A and 7B). The bonding layer 112 can be formed using a material similar to that of the bonding layer 120.

[Separation of Counter Element Formation Substrate from Insulating Layer]

Figure 8A:
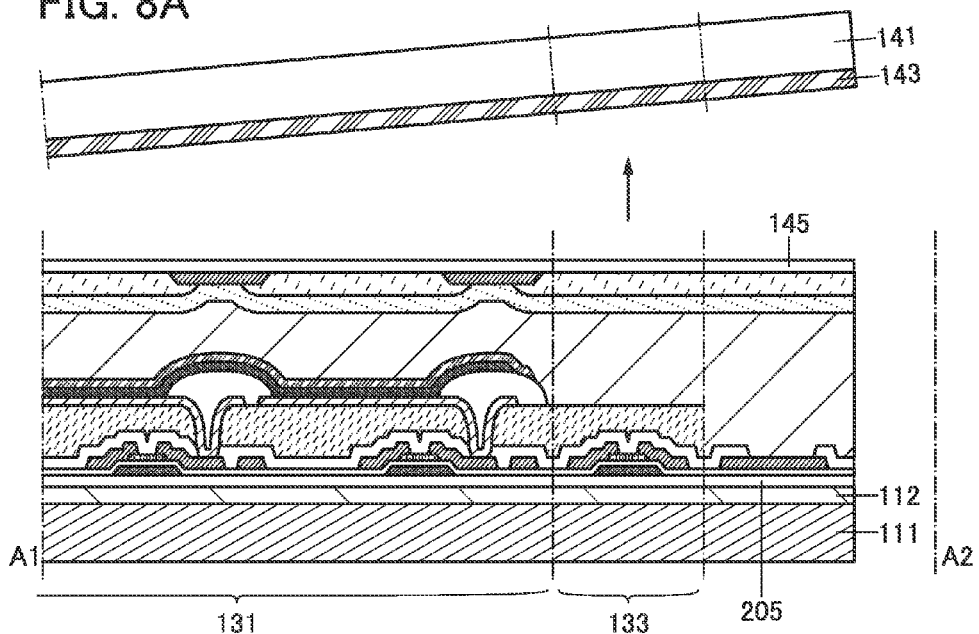
FIGS. 8A and 8B are cross-sectional views illustrating an example of a method for fabricating a display device.

Next, the element formation substrate 141 in indirect contact with the insulating layer 145 via the separation layer 143 is separated from the insulating layer 145 (see FIG. 8A). The element formation substrate 141 can be separated in a manner similar to that of the above-described separation method of the element formation substrate 101.

[Bonding of Substrate]

Figure 8B:
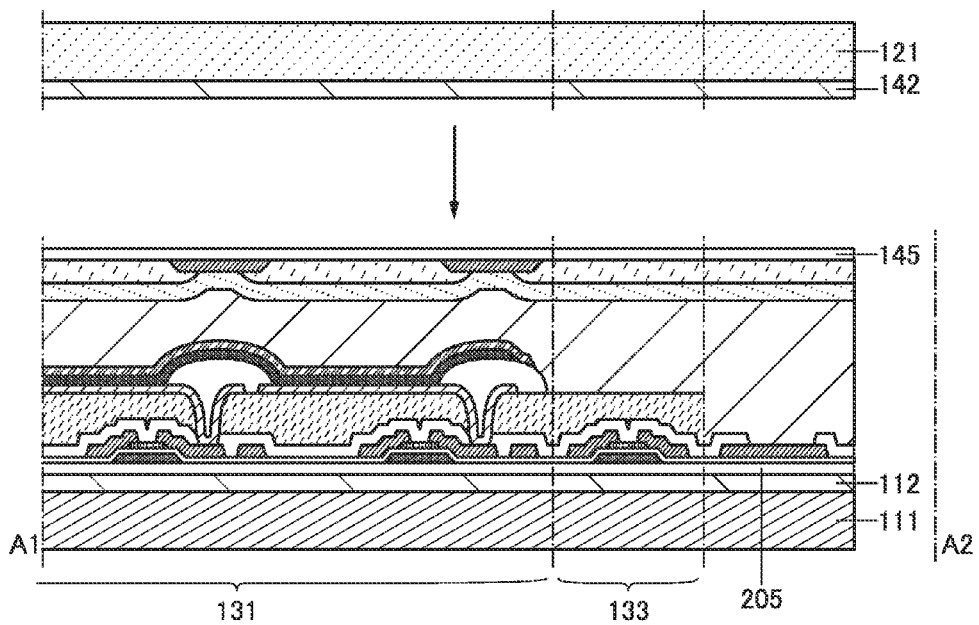

Next, the substrate 121 is attached to the insulating layer 145 with the bonding layer 142 therebetween (see FIG. 8B). The bonding layer 142 can be formed using a material similar to that of the bonding layer 120.

[Formation of Opening]

Figure 9A:
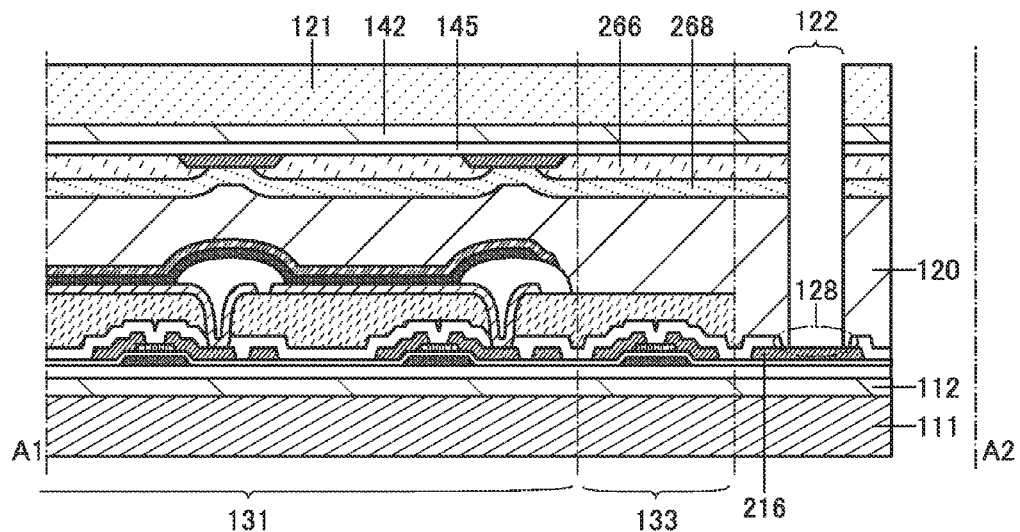
FIGS. 9A and 9B are cross-sectional views illustrating an example of a method for fabricating a display device.

Next, the substrate 121, the bonding layer 142, the insulating layer 145, the coloring layer 266, the overcoat layer 268, and the bonding layer 120 in a region overlapping the terminal electrode 216 and the opening 128 are removed to form the opening 122 (see FIG. 9A). A surface of the terminal electrode 216 is partly exposed by the formation of the opening 122.

[Formation of External Electrode]

Figure 9B:
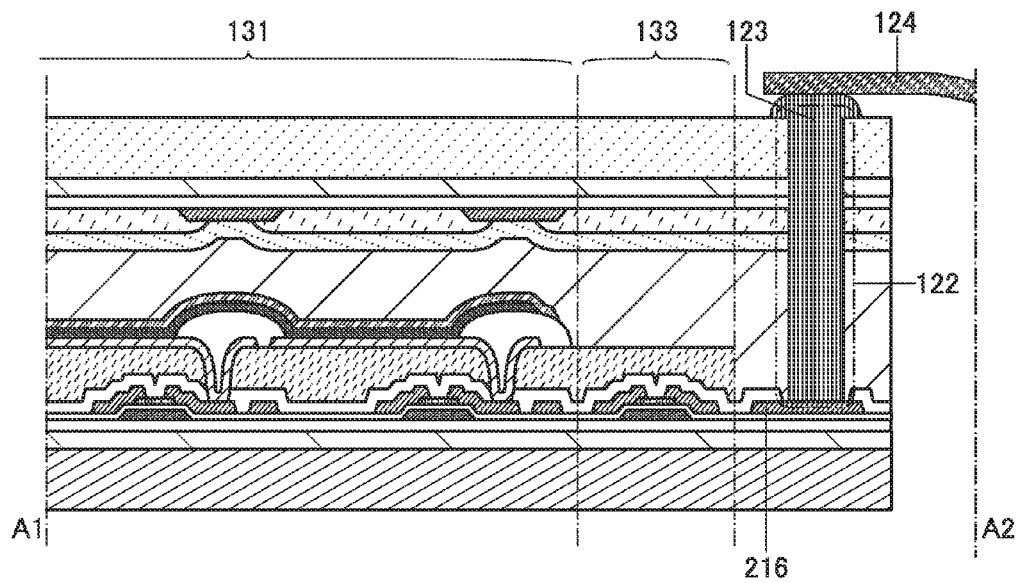

Next, the anisotropic conductive connection layer 123 is formed in the opening 122, and the external electrode 124 for inputting electric power or a signal to the display device 100 is formed over the anisotropic conductive connection layer 123 (see FIG. 9B). The terminal electrode 216 is electrically connected to the external electrode 124 through the anisotropic conductive connection layer 123. For example, a flexible printed circuit (FPC) can be used as the external electrode 124.

The anisotropic conductive connection layer 123 can be formed using any of known anisotropic conductive films (ACF), anisotropic conductive pastes (ACP), and the like.

The anisotropic conductive connection layer 123 is formed by curing a paste-form or sheet-form material that is obtained by mixing conductive particles to a thermosetting resin or a thermosetting, light curable resin. The anisotropic conductive connection layer 123 exhibits an anisotropic conductive property by light irradiation or thermocompression bonding. As the conductive particles used for the anisotropic conductive connection layer 123, for example, particles of a spherical organic resin coated with a thin-film metal such as Au, Ni, or Co can be used.

By electrical connection between the external electrode 124 and the terminal electrode 216 through the anisotropic conductive connection layer 123, electric power or signals can be input to the display device 100.

[Components Formed Over Counter Element Formation Substrate]

Next, components, such as the light-blocking layer 264, formed over the element formation substrate 141 are described with reference to FIGS. 10A to 10D.

First, the element formation substrate 141 is prepared. The element formation substrate 141 can be formed using a material similar to that of the element formation substrate 101. Then, the separation layer 143 and the insulating layer 145 are formed over the element formation substrate 141 (see FIG. 10A). The separation layer 143 can be formed using a material and a method similar to those of the separation layer 113. The insulating layer 145 can be formed using a material and a method similar to those of the insulating layer 205.

Figure 10A:
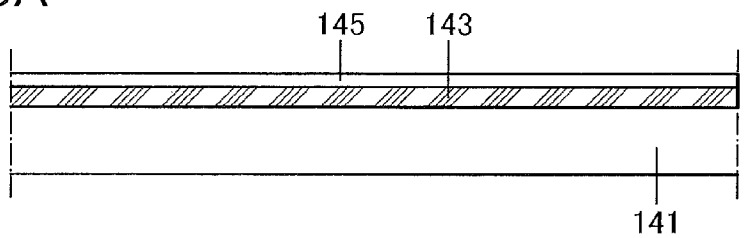
FIGS. 10A to 10D are cross-sectional views illustrating an example of a method for fabricating a display device.
Figure 10B:
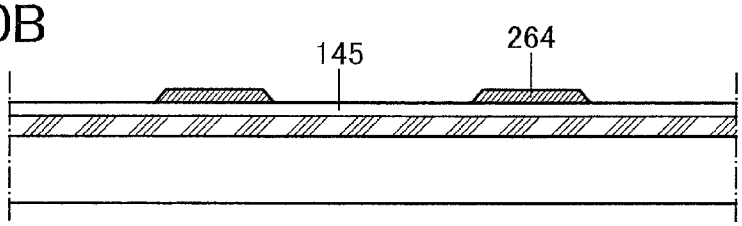
Figure 10C:
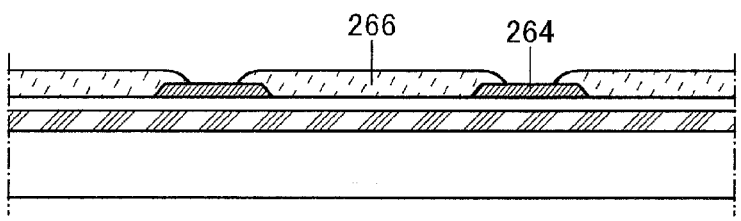

Next, the light-blocking layer 264 is formed over the insulating layer 145 (see FIG. 10B). After that, the coloring layer 266 is formed (see FIG. 10C).

The light-blocking layer 264 and the coloring layer 266 each are formed in a desired position with any of various materials by a printing method, an inkjet method, a photolithography method, or the like.

Figure 10D:
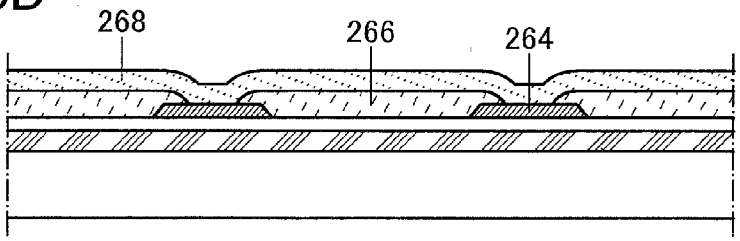

Next, the overcoat layer 268 is formed over the light-blocking layer 264 and the coloring layer 266 (see FIG. 10D).

For the overcoat layer 268, an organic insulating layer of an acrylic resin, an epoxy resin, polyimide, or the like can be used. With the overcoat layer 268, for example, an impurity or the like contained in the coloring layer 266 can be prevented from diffusing into the light-emitting element 125 side. Note that the overcoat layer 268 is not necessarily formed.

A light-transmitting conductive film may be formed as the overcoat layer 268. The light-transmitting conductive film is formed as the overcoat layer 268, so that the light 235 emitted from the light-emitting element 125 can be transmitted through the overcoat layer 268 and layers overlapping the overcoat layer 268, while ionized impurities can be prevented from passing through the overcoat layer 268.

The light-transmitting conductive film can be formed using, for example, indium oxide, indium tin oxide (ITO), indium zinc oxide, zinc oxide, or zinc oxide to which gallium is added. Graphene or a metal film that is thin enough to have a light-transmitting property can also be used.

Through the above-described steps, the components such as the light-blocking layer 264 can be formed over the element formation substrate 141.

This embodiment can be implemented in an appropriate combination with any of the structures described in the other embodiments.

Embodiment 3

A display device 150 having a bottom-emission structure can be fabricated by modification of the structure of the display device 100 having a top-emission structure.

Figure 11:
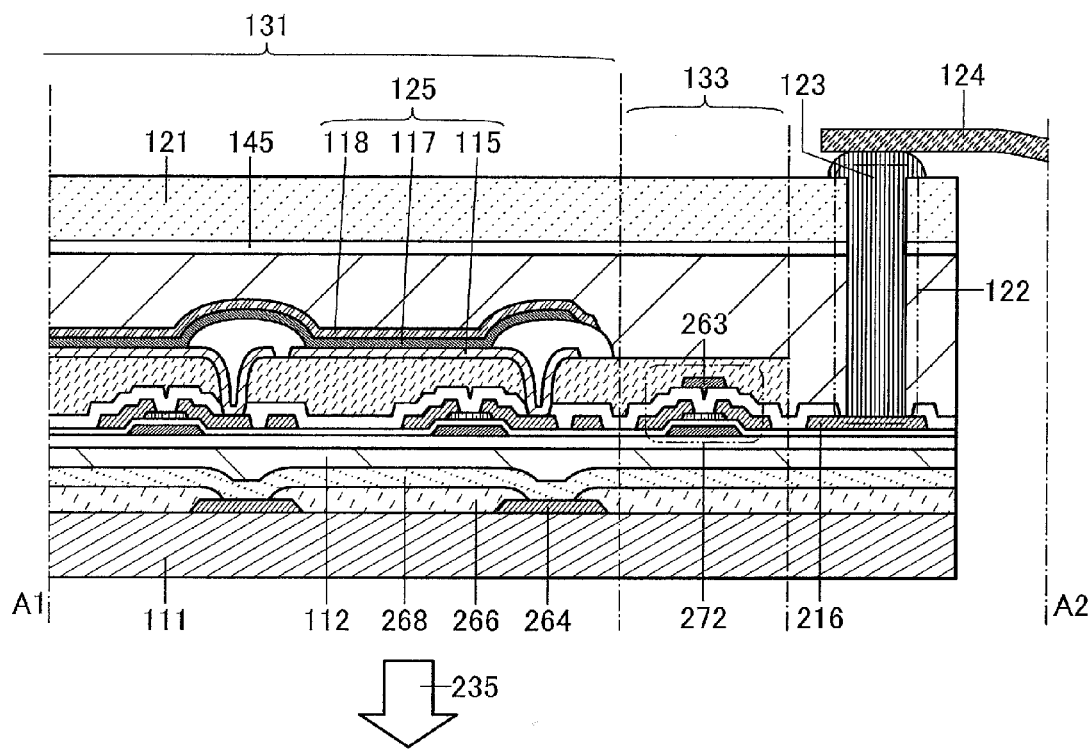
FIG. 11 illustrates one mode of a display device.

FIG. 11 illustrates an example of a cross-sectional structure of the display device 150 having a bottom-emission structure. Note that FIG. 11 is a cross-sectional view of a portion similar to the portion denoted by the dashed-dotted line A1-A2 in FIG. 1A that is a perspective view of the display device 100. The display device 150 having a bottom-emission structure differs from the display device 100 in the position where the light-blocking layer 264, the coloring layer 266, and the overcoat layer 268 are formed. Specifically, in the display device 150, the light-blocking layer 264, the coloring layer 266, and the overcoat layer 268 are formed over the substrate 111.

In the display device 150, the substrate 121 on which the insulating layer 145 is directly formed can be attached to the substrate 111 with the bonding layer 120 therebetween. In other words, the insulating layer 145 does not need to be transferred from the element formation substrate 141; thus, the element formation substrate 141, the separation layer 143, and the bonding layer 142 are not needed. This can improve the productivity, yield, and the like of the display device. Note that other components of the display device 150 can be formed as in the case of the display device 100.

In the display device 150 having a bottom-emission structure, the electrode 115 is formed using a light-transmitting conductive material, and the electrode 118 is formed using a conductive material that efficiently reflects light emitted from the EL layer 117.

In the display device 150, the light 235 emitted from the EL layer 117 can be extracted from the substrate 111 side through the coloring layer 266.

Note that the display device 150 is an example of a display device in which a transistor 272 is used as a transistor included in the driver circuit 133. Although the transistor 272 can be formed in a manner similar to that of the transistor 252, the transistor 272 differs from the transistor 252 in that an electrode 263 is formed over the insulating layer 210 in a region overlapping the semiconductor layer 208. The electrode 263 can be formed using a material and a method similar to those of the gate electrode 206.

The electrode 263 can also serve as a gate electrode. In the case where one of the gate electrode 206 and the electrode 263 is simply referred to as a "gate electrode", the other may be referred to as a "back gate electrode". One of the gate electrode 206 and the electrode 263 may be referred to as a "first gate electrode", and the other may be referred to as a "second gate electrode".

In general, the back gate electrode is formed using a conductive film and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode, the threshold voltage of the transistor can be changed.

Furthermore, the gate electrode and the back gate electrode are formed using conductive films and thus each have a function of preventing an electric field generated outside the transistor from influencing the semiconductor layer in which the channel is formed (in particular, a function of blocking static electricity).

In the case where light is incident on the back gate electrode side, when the back gate electrode is formed using a light-blocking conductive film, light can be prevented from entering the semiconductor layer from the back gate electrode side. Thus, photodegradation of the semiconductor layer can be prevented and deterioration in electrical characteristics of the transistor, such as a shift of the threshold voltage, can be prevented.

By providing the gate electrode 206 and the electrode 263 with the semiconductor layer 208 therebetween and setting the potentials of the gate electrode 206 and the electrode 263 to be equal, a region of the semiconductor layer 208 through which carriers flow is enlarged in the film thickness direction; thus, the number of transferred carriers is increased. As a result, the on-state current and the field-effect mobility of the transistor are increased.

The gate electrode 206 and the electrode 263 each have a function of blocking an external electric field; thus, charges in a layer under the gate electrode 206 and in a layer over the electrode 263 do not affect the semiconductor layer 208. Thus, there is little change in the threshold voltage in a stress test (e.g., a negative gate bias temperature (−GBT) stress test in which a negative voltage is applied to a gate or a +GBT stress test in which a positive voltage is applied to a gate). In addition, changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in threshold voltage of the transistor in the BT stress test is an important indicator when examining the reliability of the transistor. As the amount of change in the threshold voltage in the BT stress test is small, the transistor has higher reliability.

By providing the gate electrode 206 and the electrode 263 and setting the potentials of the gate electrode 206 and the electrode 263 to be the same, the amount of change in the threshold voltage is reduced. Accordingly, variation in electrical characteristics among a plurality of transistors is also reduced.

Note that a back gate electrode may be provided in the transistor 232 formed in the display area 131.

Note that as in FIGS. 15A and 15B and FIGS. 16A and 16B, a touch sensor may be provided. FIGS. 17A and 17B and FIGS. 18A and 18B illustrate examples of such cases.

This embodiment can be implemented in an appropriate combination with any of the structures described in the other embodiments.

Embodiment 4

In this embodiment, structure examples of a light-emitting element that can be applied to the light-emitting element 125 are described. Note that an EL layer 320 described in this embodiment corresponds to the EL layer 117 described in the above embodiment.

<Structure of Light-Emitting Element>

Figure 12A:
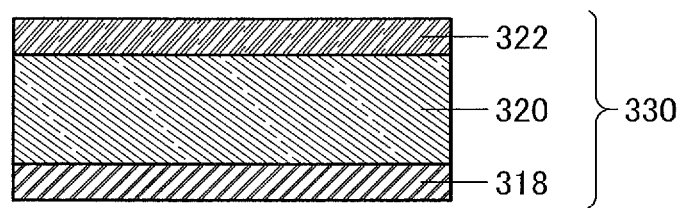
FIGS. 12A and 12B illustrate structure examples of light-emitting elements.

In a light-emitting element 330 illustrated in FIG. 12A, the EL layer 320 is interposed between a pair of electrodes (an electrode 318 and an electrode 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

The light-emitting element 330 illustrated in FIG. 12A emits light when current flows because of a potential difference generated between the electrode 318 and the electrode 322 and holes and electrons are recombined in the EL layer 320. That is, the light-emitting region is formed in the EL layer 320.

In the present invention, light emitted from the light-emitting element 330 is extracted to the outside from the electrode 318 side or the electrode 322 side. Thus, one of the electrode 318 and the electrode 322 is formed of a light-transmitting substance.

Figure 12B:
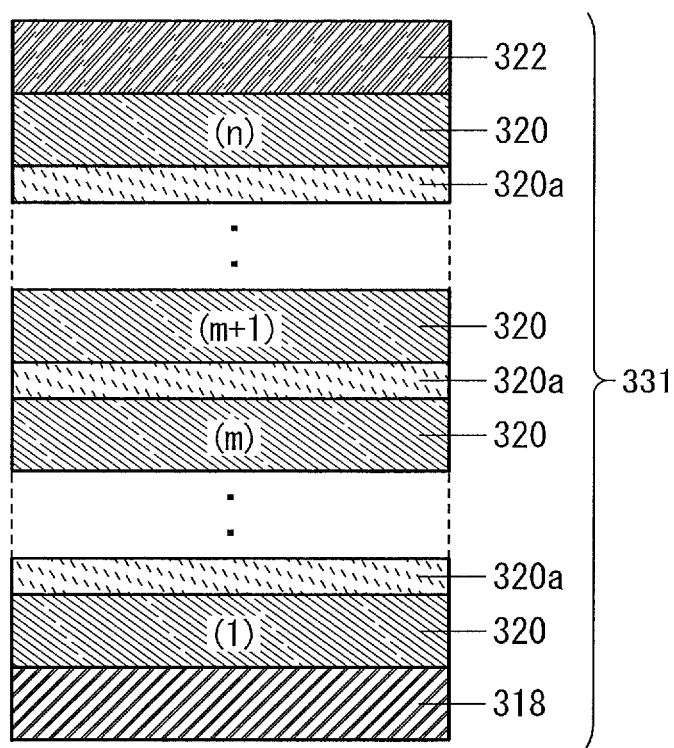

Note that a plurality of EL layers 320 may be stacked between the electrode 318 and the electrode 322 as in a light-emitting element 331 illustrated in FIG. 12B. In the case where n (n is a natural number of 2 or more) layers are stacked, a charge generation layer 320a is preferably provided between an m-th EL layer 320 and an (m+1)-th EL layer 320. Note that m is a natural number greater than or equal to 1 and less than n.

The charge generation layer 320a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, and tungsten oxide. As the organic compound, a variety of compounds can be used; for example, low molecular compounds such as an aromatic amine compound, a carbazole derivative, and aromatic hydrocarbon and oligomers, dendrimers, and polymers of these low molecular compounds. As the organic compound, it is preferable to use the organic compound which has a hole-transport property and has a hole mobility of $10^{-6}$ cm$^2$/Vs or higher. However, any substance other than the above-described materials may also be used as long as the substance has a higher hole-transport property than an electron-transport property. These materials used for the charge generation layer 320a have excellent carrier-injection properties and carrier-transport properties; thus, the light-emitting element 330 can be driven with low current and with low voltage.

Note that the charge generation layer 320a may be formed with a combination of a composite material of the organic compound and the metal oxide with another material. For example, a layer containing a composite material of the organic compound and the metal oxide may be combined with a layer containing a compound of a substance selected from substances having an electron-donating property and a compound having a high electron-transport property. Moreover, a layer containing a composite material of the organic compound and the metal oxide may be combined with a transparent conductive film.

The light-emitting element 331 having such a structure is unlikely to have problems such as energy transfer and quenching and has an expanded choice of materials, and thus can easily have both high emission efficiency and a long lifetime. Moreover, it is easy to obtain phosphorescence from one light-emitting layer and fluorescence from the other light-emitting layer.

The charge generation layer 320a has a function of injecting holes to one of the EL layers 320 that is in contact with the charge generation layer 320a and a function of injecting electrons to the other EL layer 320 that is in contact with the charge generation layer 320a, when voltage is applied between the electrode 318 and the electrode 322.

The light-emitting element 331 illustrated in FIG. 12B can provide a variety of emission colors by changing the type of the light-emitting substance used for the EL layer 320. In addition, a plurality of light-emitting substances emitting light of different colors may be used as the light-emitting substances, whereby light emission having a broad spectrum or white light emission can be obtained.

In the case of obtaining white light emission using the light-emitting element 331 illustrated in FIG. 12B, as for the combination of a plurality of EL layers, a structure for emitting white light including red light, green light, and blue light may be used; for example, the structure may include a light-emitting layer containing a blue fluorescent substance as a light-emitting substance and a light-emitting layer containing red and green phosphorescent substances as light-emitting substances. Alternatively, a structure including a light-emitting layer emitting red light, a light-emitting layer emitting green light, and a light-emitting layer emitting blue light may be employed. Further alternatively, with a structure including light-emitting layers emitting light of complementary colors, white light emission can be obtained. In a stacked-layer element including two light-emitting layers in which light emitted from one of the light-emitting layers and light emitted from the other light-emitting layer have complementary colors to each other, the combinations of colors are as follows: blue and yellow, blue-green and red, and the like.

Note that in the structure of the above-described stacked-layer element, by providing the charge generation layer between the stacked light-emitting layers, the element can have a long lifetime in a high-luminance region while keeping the current density low. In addition, the voltage drop due to the resistance of the electrode material can be reduced, whereby uniform light emission in a large area is possible.

This embodiment can be implemented in an appropriate combination with any of the structures described in the other embodiments.

Embodiment 5

In this embodiment, examples of an electronic appliance and a lighting device that include the display device of one embodiment of the present invention are described with reference to drawings As examples of electronic appliances with flexibility, the following can be given: television devices (also called televisions or television receivers), monitors of computers or the like, digital cameras, digital video cameras, digital photo frames, mobile phones (also called cellular phones or mobile phone devices), portable game machines, portable information terminals, audio reproducing devices, and large game machines such as pachinko machines.

In addition, a lighting device or a display device can be incorporated along a curved inside/outside wall surface of a house or a building or a curved interior/exterior surface of a car.

Figure 13A:
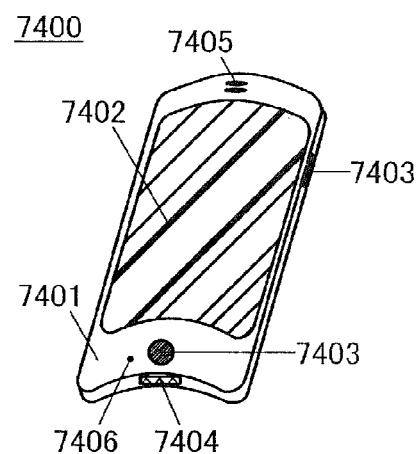
FIGS. 13A to 13D illustrate examples of electronic appliances and lighting devices.

FIG. 13A illustrates an example of a mobile phone. A mobile phone 7400 is provided with a display portion 7402 incorporated in a housing 7401, an operation button 7403, an external connection port 7404, a speaker 7405, a microphone 7406, and the like. Note that the mobile phone 7400 is manufactured using the display device in the display portion 7402.

When the display portion 7402 of the mobile phone 7400 illustrated in FIG. 13A is touched with a finger or the like, data can be input to the mobile phone 7400. In addition, operations such as making a call and inputting text can be performed by touch on the display portion 7402 with a finger or the like The power can be turned on or off with the operation button 7403. In addition, types of images displayed on the display portion 7402 can be switched: for example, switching images from a mail creation screen to a main menu screen is performed with the operation button 7403.

Here, the display portion 7402 includes the display device of one embodiment of the present invention. Thus, the mobile phone can have a curved display portion and high reliability.

Figure 13B:
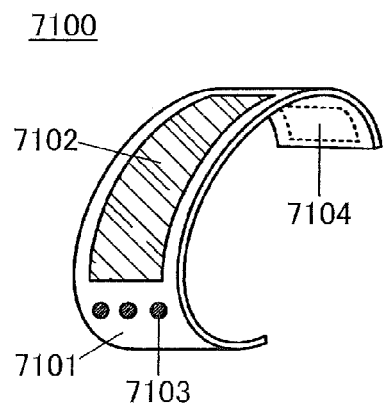

FIG. 13B illustrates an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7104 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the mobile display device can have a curved display portion and high reliability.

Figure 13C:
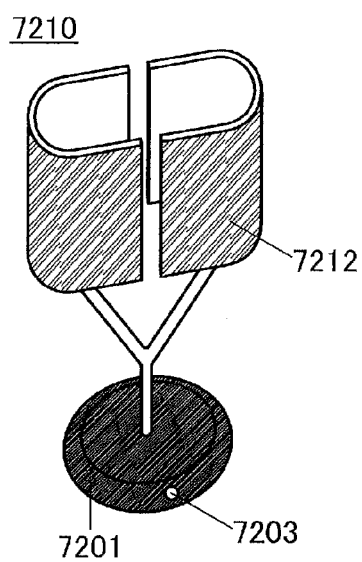
Figure 13D:
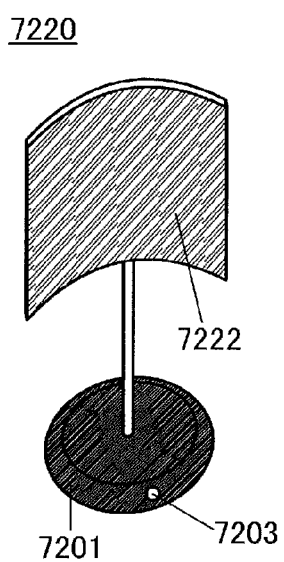

FIGS. 13C and 13D illustrate examples of lighting devices. Lighting devices 7200, 7210, and 7220 each include a stage 7201 provided with an operation switch 7203 and a light-emitting portion supported by the stage 7201.

A light-emitting portion 7212 included in the lighting device 7210 illustrated in FIG. 13C has two convex-curved light-emitting portions symmetrically placed. Thus, light radiates from the lighting device 7210.

The lighting device 7220 illustrated in FIG. 13D includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion may be fixed on a plastic member, a movable frame, or the like so that an emission surface of the light-emitting portion can be bent freely depending on the intended use.

The light-emitting portions included in the lighting devices 7200, 7210, and 7220 each include the display device of one embodiment of the present invention. Thus, the lighting devices can have curved display portions and high reliability.

Figure 14A:
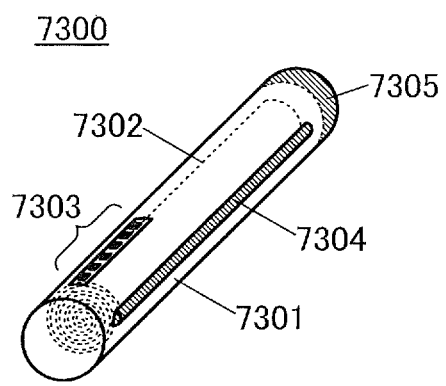
FIGS. 14A and 14B illustrate an example of an electronic appliance.

FIG. 14A illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301. The display portion 7302 includes a first substrate provided with a light-blocking layer and the like and a second substrate provided with a transistor and the like. The display portion 7302 is rolled so that the second substrate is positioned against an inner wall of the housing 7301.

The display device 7300 can receive a video signal with the control portion 7305 and can display the received video on the display portion 7302. In addition, a battery is included in the control portion 7305. Moreover, a connector may be included in the control portion 7305 so that a video signal or power can be supplied directly.

With the operation buttons 7303, power ON/OFF, switching of displayed videos, and the like can be performed.

Figure 14B:
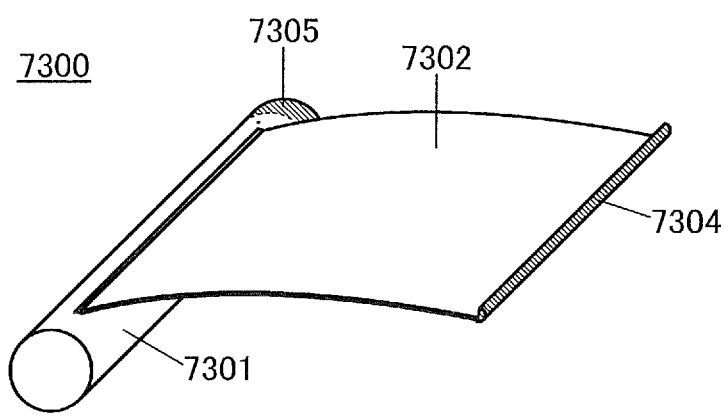

FIG. 14B illustrates a state in which the display portion 7302 is pulled out with the display portion pull 7304. Videos can be displayed on the display portion 7302 in this state. In addition, the operation buttons 7303 on the surface of the housing 7301 allow one-handed operation Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a flexible, highly reliable display device, which makes the display device 7300 lightweight and highly reliable.

It is needless to say that one embodiment of the present invention is not limited to the above-described electronic devices and lighting devices as long as the display device of one embodiment of the present invention is included.

The structures, methods, and the like described in this embodiment can be used as appropriate in combination with any of the structures, methods, and the like described in other embodiments.

This application is based on Japanese Patent Application serial no. 2013-155990 filed with the Japan Patent Office on Jul. 26, 2013, the entire contents of which are hereby incorporated by reference.

What is claimed is:

1. A display device comprising:
a first substrate;
a second substrate below the first substrate;
a transistor on the second substrate, between the first substrate and the second substrate; and
a third bonding layer between the first substrate and each of the transistor and the second substrate,
wherein the third bonding layer comprises an adhesive material,
wherein the first and the second substrates are flexible, and
wherein the display device is provided with a bent portion able to display an image so that the second substrate is positioned on an outer side and the first substrate on an inner side in the bend portion.

2. The display device according to claim 1,
wherein the display device can be folded in thirds.

3. The display device according to claim 1,
wherein the display device can be folded so that a first and a second portion of the display device are inserted between a third and a fourth portion of the display device, the first to fourth portions being arranged substantially parallel to one another.

4. The display device according to claim 1, further comprising:
wirings arranged in a grid pattern on the second substrate.

5. The display device according to claim 1, further comprising:
an oxide semiconductor layer,
wherein a channel formation region of the transistor is included in the oxide semiconductor layer.

6. The display device according to claim 1, further comprising:
a light-emitting element connected to the transistor.

7. The display device according to claim 1, further comprising:
a light-emitting element connected to the transistor; and
a light-blocking layer and a coloring layer below the transistor.

8. The display device according to claim 1, further comprising:
a touch sensor below the second substrate.

9. The display device according to claim 1, further comprising:
a light-emitting element connected to the transistor;
a light-blocking layer and a coloring layer below the transistor; and
a touch sensor in contact with a third substrate, below the second substrate.

10. The display device according to claim 1, further comprising:
wirings arranged in a grid pattern on the second substrate.

11. The display device according to claim 1, further comprising:
a touch sensor over the first substrate.

12. A display device comprising:
a first substrate;
a first insulating layer underneath the first substrate;
a light-blocking layer and a coloring layer each underneath the first substrate with the first insulating layer therebetween;
a second substrate below the first substrate;
a second insulating layer over the second substrate;
a transistor comprising a semiconductor layer, a gate electrode, a source electrode, and a drain electrode on the second substrate with the second insulating layer therebetween;
a transistor insulating layer over the transistor;
a light-emitting element over the transistor with the transistor insulating layer therebetween, the light-emitting element including a first electrode, a second electrode, and an EL layer between the first electrode and the second electrode, the first electrode being electrically connected to the semiconductor layer via one of the source electrode and the drain electrode;
a first bonding layer between the first substrate and the first insulating layer;
a second bonding layer between the second substrate and the second insulating layer; and
a third bonding layer between the second electrode and the first substrate,
wherein each of the first to the third bonding layers comprises an adhesive material,
wherein the first and the second substrates are flexible, and
wherein the display device is provided with a bent portion able to display an image so that the second substrate is positioned on an outer side and the first substrate on an inner side in the bend portion.

13. The display device according to claim 12, further comprising:
wirings arranged in a grid pattern on the second substrate.

14. The display device according to claim 10,
wherein the first to third bonding layers comprise a same adhesive material.

15. The display device according to claim 12,
wherein the first and the third bonding layers comprise a same adhesive material.

16. The display device according to claim 12, further comprising:
an oxide semiconductor layer,
wherein a channel formation region of the transistor is included in the oxide semiconductor layer.

17. The display device according to claim 12, further comprising:
a third substrate over the first substrate; and
a touch sensor on the third substrate.

18. A display device comprising:
a first substrate;
a touch sensor over the first substrate;
a first insulating layer underneath the first substrate;
a light-blocking layer and a coloring layer each underneath the first substrate with the first insulating layer therebetween;
a second substrate below the first substrate;
a second insulating layer over the second substrate;
a transistor comprising a semiconductor layer, a gate electrode, a source electrode, and a drain electrode on the second substrate with the second insulating layer therebetween;
a transistor insulating layer over the transistor;
a light-emitting element over the transistor with the transistor insulating layer therebetween, the light-emitting element including a first electrode, a second electrode, and an EL layer between the first electrode and the second electrode, the first electrode being electrically connected to the semiconductor layer via one of the source electrode and the drain electrode;
a first bonding layer between the first substrate and the first insulating layer;
a second bonding layer between the second substrate and the second insulating layer; and
a third bonding layer between the second electrode and the first substrate, wherein each of the first to the third bonding layers comprises an adhesive material, wherein the first and the second substrates are flexible, and wherein the display device can have a bend portion displaying an image so that the second substrate is positioned on an outer side and the first substrate on an inner side in the bend portion.

19. The display device according to claim 18, further comprising:

wirings arranged in a grid pattern on the second substrate.

20. The display device according to claim 18, wherein the touch sensor is formed on the first substrate.

21. The display device according to claim 18, further comprising:

a fourth substrate on which is formed the touch sensor.

22. The display device according to claim 18, wherein the first to third bonding layers comprise a same adhesive material.

23. The display device according to claim 18, wherein the first and the third bonding layers comprise a same adhesive material.

24. The display device according to claim 18, further comprising:

an oxide semiconductor layer, wherein a channel formation region of the transistor is included in the oxide semiconductor layer.

* * * * *